(12) United States Patent
Kim et al.

(10) Patent No.: US 10,964,720 B2
(45) Date of Patent: Mar. 30, 2021

(54) SEMICONDUCTOR MEMORY DEVICE

(71) Applicant: Samsung Electronics Co., Ltd., Suwon-si (KR)

(72) Inventors: Jong Won Kim, Hwaseong-si (KR); Kwang Young Jung, Hwaseong-si (KR); Dong Seog Eun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/028,047

(22) Filed: Sep. 22, 2020

(65) Prior Publication Data
US 2021/0028190 A1 Jan. 28, 2021

Related U.S. Application Data

(63) Continuation of application No. 16/719,089, filed on Dec. 18, 2019, now Pat. No. 10,854,631, which is a (Continued)

(30) Foreign Application Priority Data

Jun. 1, 2017 (KR) ........................ 10-2017-0068697

(51) Int. Cl.
*H01L 27/11582* (2017.01)
*G11C 11/4099* (2006.01)
(Continued)

(52) U.S. Cl.
CPC .......... *H01L 27/11582* (2013.01); *G11C 7/14* (2013.01); *G11C 11/4099* (2013.01);
(Continued)

(58) Field of Classification Search
CPC ......... H01L 27/11582; H01L 27/11526; H01L 27/11565; H01L 27/1157; H01L 27/11575; G11C 7/14; G11C 11/4099; G11C 16/107
(Continued)

(56) References Cited

U.S. PATENT DOCUMENTS 9,171,860 B2   10/2015   Chae et al.
9,412,749 B1   8/2016    Shimabukuro et al.
(Continued)

*Primary Examiner* — Connie C Yoha
(74) *Attorney, Agent, or Firm* — Harness, Dickey & Pierce, P.L.C.

(57) ABSTRACT

A semiconductor memory device including a substrate including a first block and a second block each having a cell array region and a connection region, a stack including insulating layers and gate electrodes and extending from the cell array region to the connection region, first cell channel structures in the cell array region of the first block and passing through the stack to be electrically connected to the substrate, first dummy channel structures in the connection region of the first block and passing through the stack, second cell channel structures in the cell array region of the second block and passing through the stack, and second dummy channel structures in the connection region of the second block and passing through the stack may be provided. The first dummy channel structures are electrically insulated from the substrate, while the second dummy channel structures are electrically connected to the substrate.

11 Claims, 34 Drawing Sheets

Related U.S. Application Data continuation of application No. 15/841,523, filed on Dec. 14, 2017, now Pat. No. 10,546,874.

(51) Int. Cl.

| | |
|---|---|
| *H01L 27/11526* | (2017.01) |
| *H01L 27/11565* | (2017.01) |
| *G11C 16/10* | (2006.01) |
| *H01L 27/11575* | (2017.01) |
| *H01L 27/1157* | (2017.01) |
| *G11C 7/14* | (2006.01) |

(52) U.S. Cl.
CPC ........ *G11C 16/107* (2013.01); *H01L 27/1157* (2013.01); *H01L 27/11526* (2013.01); *H01L 27/11565* (2013.01); *H01L 27/11575* (2013.01)

(58) Field of Classification Search
USPC ................ 365/210.1, 210, 230.03, 185.11
See application file for complete search history.

(56) References Cited

U.S. PATENT DOCUMENTS

| | | | |
|---|---|---|---|
| 9,425,208 B2 | 8/2016 | Kim et al. | |
| 9,478,561 B2 | 10/2016 | Kim et al. | |
| 10,177,160 B2 | 1/2019 | Pyon et al. | |
| 10,546,874 B2 | 1/2020 | Kim et al. | |
| 10,566,345 B2 | 2/2020 | Kanamori et al. | |
| 10,685,695 B2 | 6/2020 | Jeon et al. | |
| 2015/0372101 A1 | 12/2015 | Lee et al. | |
| 2016/0049423 A1 | 2/2016 | Yoo et al. | |
| 2016/0276360 A1 | 9/2016 | Doda et al. | |
| 2016/0343727 A1 | 11/2016 | Kim et al. | |
| 2018/0122819 A1* | 5/2018 | Shim | H01L 27/11568 |
| 2018/0174661 A1 | 6/2018 | Kim et al. | |
| 2018/0261616 A1 | 9/2018 | Cho et al. | |
| 2019/0288001 A1* | 9/2019 | Yu | H01L 21/0337 |
| 2019/0326318 A1* | 10/2019 | Jung | H01L 27/1157 |

\* cited by examiner

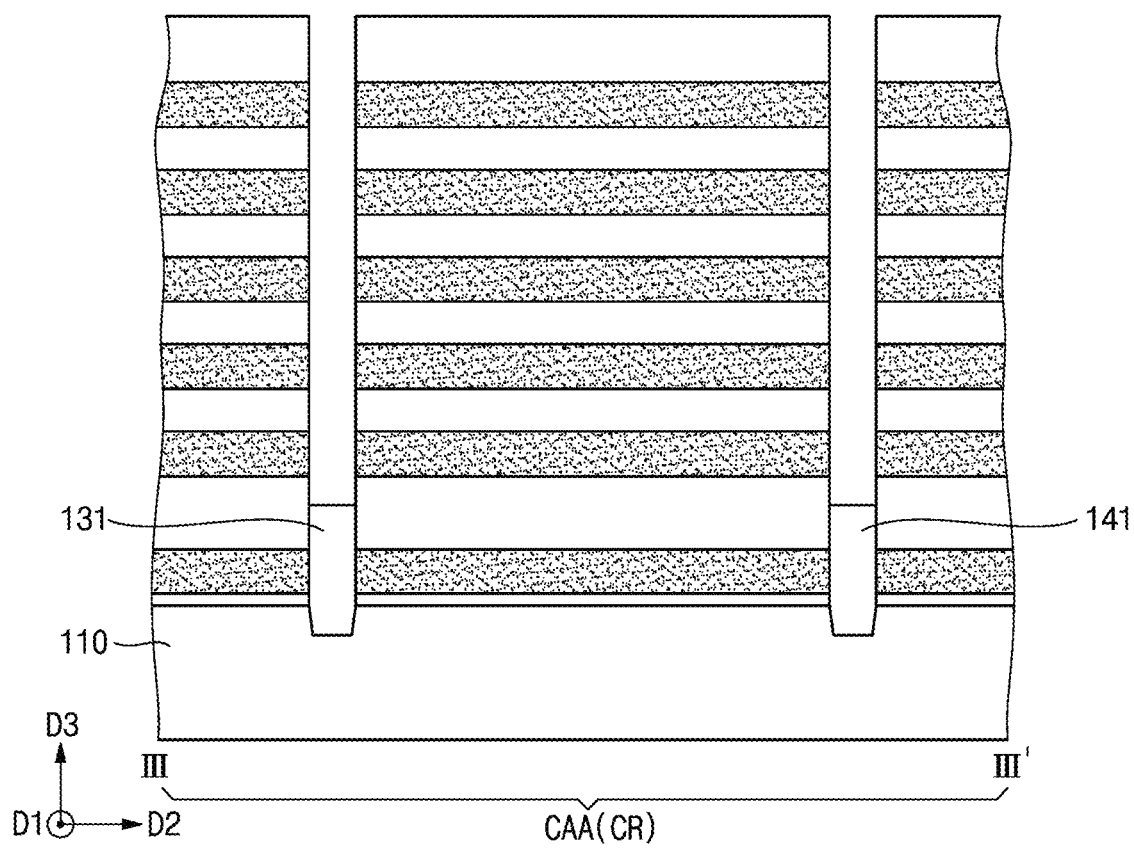

SEMICONDUCTOR MEMORY DEVICE

CROSS-REFERENCE TO RELATED APPLICATION

This application is a continuation of U.S. application Ser. No. 16/719,089, filed on Dec. 18, 2019, which is a continuation of U.S. application Ser. No. 15/841,523, filed on Dec. 14, 2017, now granted as U.S. Pat. No. 10,546,874 on Jan. 28, 2020, which claims priority under 35 U.S.C. § 119 to Korean Patent Application No. 10-2017-0068697, filed on Jun. 1, 2017, with the Korean Intellectual Property Office (KIPO), the disclosure of each of which is incorporated herein by reference in its entirety.

BACKGROUND

1. Field

Example embodiments of inventive concepts relate to vertical stack type semiconductor memory devices having a more improved integration degree and reliability.

2. Discussion of Related Art

Integration degrees of semiconductor memory devices are desired to increase so as to manufacture electronic devices to be lighter, thinner, shorter, smaller, and more price competitive. Conventionally, an integration degree of a two-dimensional (2D) or flat semiconductor memory device is determined by an area occupied by a unit memory cell. Thus, the area of the unit memory cell is largely determined by pattern microfabrication technology. For micro-fabricate patterns, highly expensive equipment is desired, and thus increasing an integration degree of a 2D semiconductor memory device has some challenges.

Recently, three-dimensional (3D) or vertical semiconductor memory devices including memory cells arranged three-dimensionally have been developed to overcome a limitation in increasing integration degrees of 2D semiconductor memory devices. A 3D semiconductor memory device includes a plurality of layers vertically stacked and a channel structure passing through the plurality of layers so as to increase an integration degree of the 3D semiconductor memory device. To mass-produce 3D semiconductor memory devices, process technology capable of providing highly reliable characteristics of products are being desired.

SUMMARY

Some example embodiments of inventive concepts provide semiconductor memory devices having a high integration degree and reliability.

According to example embodiment of inventive concepts, a semiconductor memory device includes a substrate including a first block and a second block, the first block including a first cell array region and a first connection region, and the second block including a second cell array region and a second connection region, a stack structure extending from the first and second cell array regions to the first and second connection regions, the stack structure including alternately stacked interlayer insulating layers and gate electrodes, a plurality of first cell channel structures in the first cell array region, the first cell channel structures passing through the stack structure, the first cell channel structures each connected to the substrate by a first semiconductor structure interposed therebetween, a plurality of first dummy channel structures in the first connection region, the first dummy channel structures passing through the stack structure and electrically isolated from the substrate, and a plurality of second dummy channel structures in the second connection region, the second dummy channel structures passing through the stack structure, the second dummy channel structures each connected to the substrate by a second semiconductor structure interposed therebetween.

According to example embodiment of inventive concepts, a semiconductor memory device includes a substrate including a cell block and a dummy block, the cell block including a first cell array region and a first connection region and the dummy block having a second cell array region and a second connection region, a stack structure on the substrate, the stack structure including alternately stacked interlayer insulating layers and gate electrodes, the stack structure extending from the first and second cell array regions to the first and second connection regions, a plurality of first dummy channel structures in the first connection region, the first dummy channel structures passing through the stack structure and electrically isolated from the substrate, and a plurality of second dummy channel structures in the second connection region, the second dummy channel structures passing through the stack structure, the second dummy channel structures connected to the substrate by a plurality of first semiconductor structures interposed therebetween.

According to example embodiment of inventive concepts, a method of manufacturing a semiconductor memory device includes forming a first block and a second block on a substrate, the first block including a first cell array region and a first connection region, and the second block including a second cell array region and a second connection region, forming a stack structure of interlayer insulating layers and gate electrodes to extend from the first and second cell array regions to the first and second connection regions, forming a plurality of first cell channel structures in the first cell array region such that the first cell channel structures pass through the stack structure and are connected to the substrate via a plurality of first semiconductor structures, forming a plurality of first dummy channel structures in the first connection region such that the first dummy channel structures pass through the stack structure and are electrically isolated from the substrate, forming a plurality of second dummy channel structures in the second connection region such that the second dummy channel structures pass through the stack structure and are connected to the substrate via a plurality of second semiconductor structures, determining whether the first cell channel structures electrically connect the substrate by applying an electric charge to the second dummy channel structures and measuring current between the second dummy channel structures and the substrate, and providing a select one as the semiconductor memory device in response to the determining indicating that the first cell channel structures electrically connect the substrate.

BRIEF DESCRIPTION OF THE DRAWINGS

The above and other objects, features and advantages of inventive concepts will become more apparent to those of ordinary skill in the art by describing example embodiments thereof in detail with reference to the accompanying drawings, in which:

FIGS. 13A to 20A, 13B to 20B, and 13C to 20C are vertical cross-sectional views for describing operations of a method of manufacturing a semiconductor memory device according to an example embodiment of inventive concepts, in which FIGS. 13A to 20A are vertical cross-sectional views taken along line III-III' of FIG. 2, FIGS. 13B to 20B are vertical cross-sectional views taken along line IV-IV' of FIG. 2, and FIGS. 13C to 20C are vertical cross-sectional views taken along line VI-VI' of FIG. 2;

DETAILED DESCRIPTION

Hereinafter, semiconductor memory devices according to some example embodiments of inventive concepts will be described.

First, structures of semiconductor memory devices according to some example embodiments of inventive concepts will be described.

Figure 1:
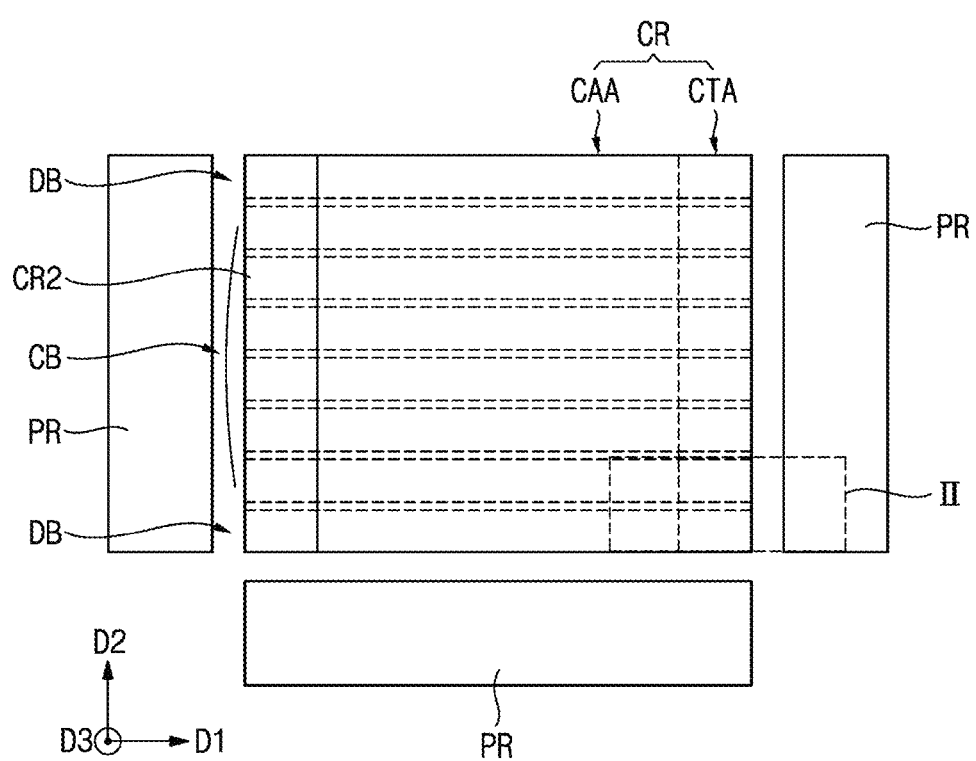
FIG. 1 is a schematic block diagram of a semiconductor memory device according to an example embodiment of inventive concepts.
Figure 2:
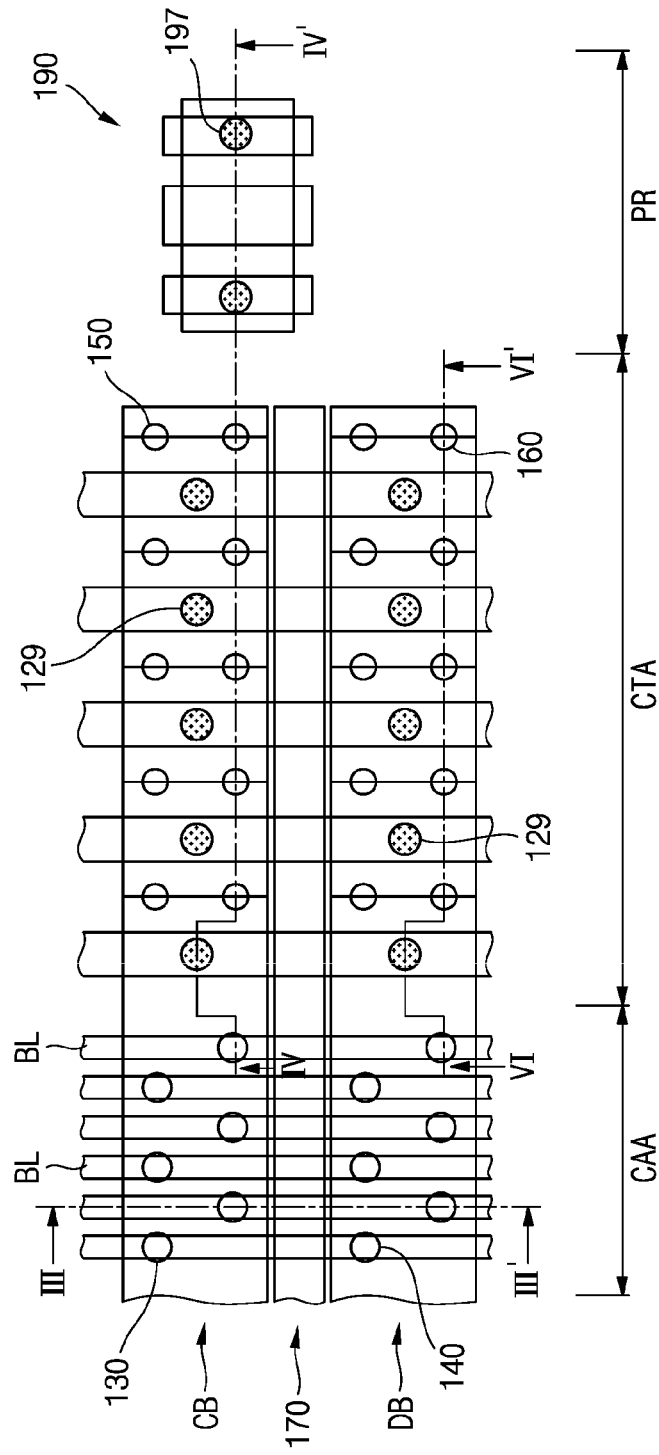
FIG. 2 is a plan view of a part II of FIG. 1.
Figure 3:
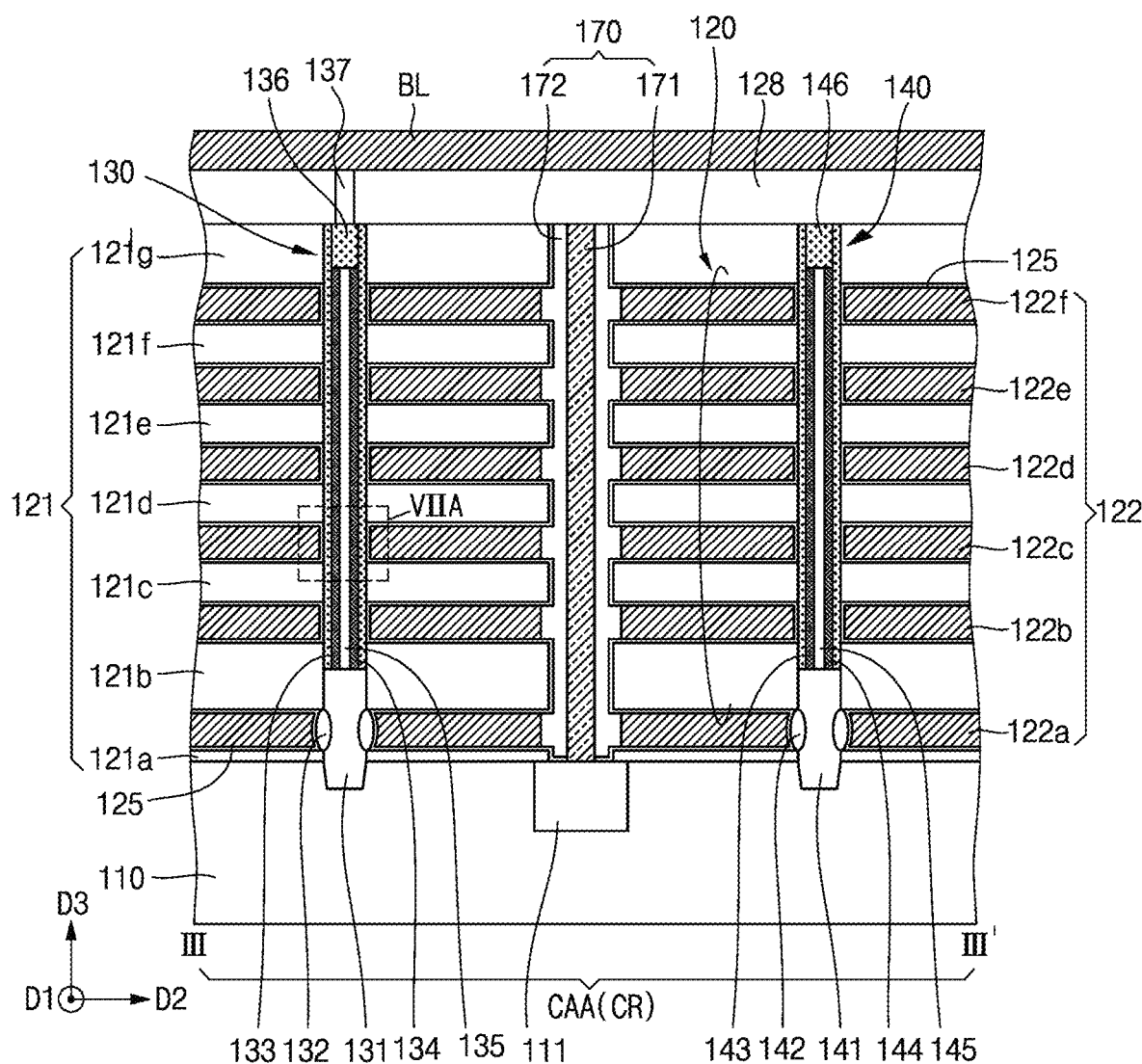
FIG. 3 is a vertical cross-sectional view taken along line III-III' of FIG. 2.
Figure 4:
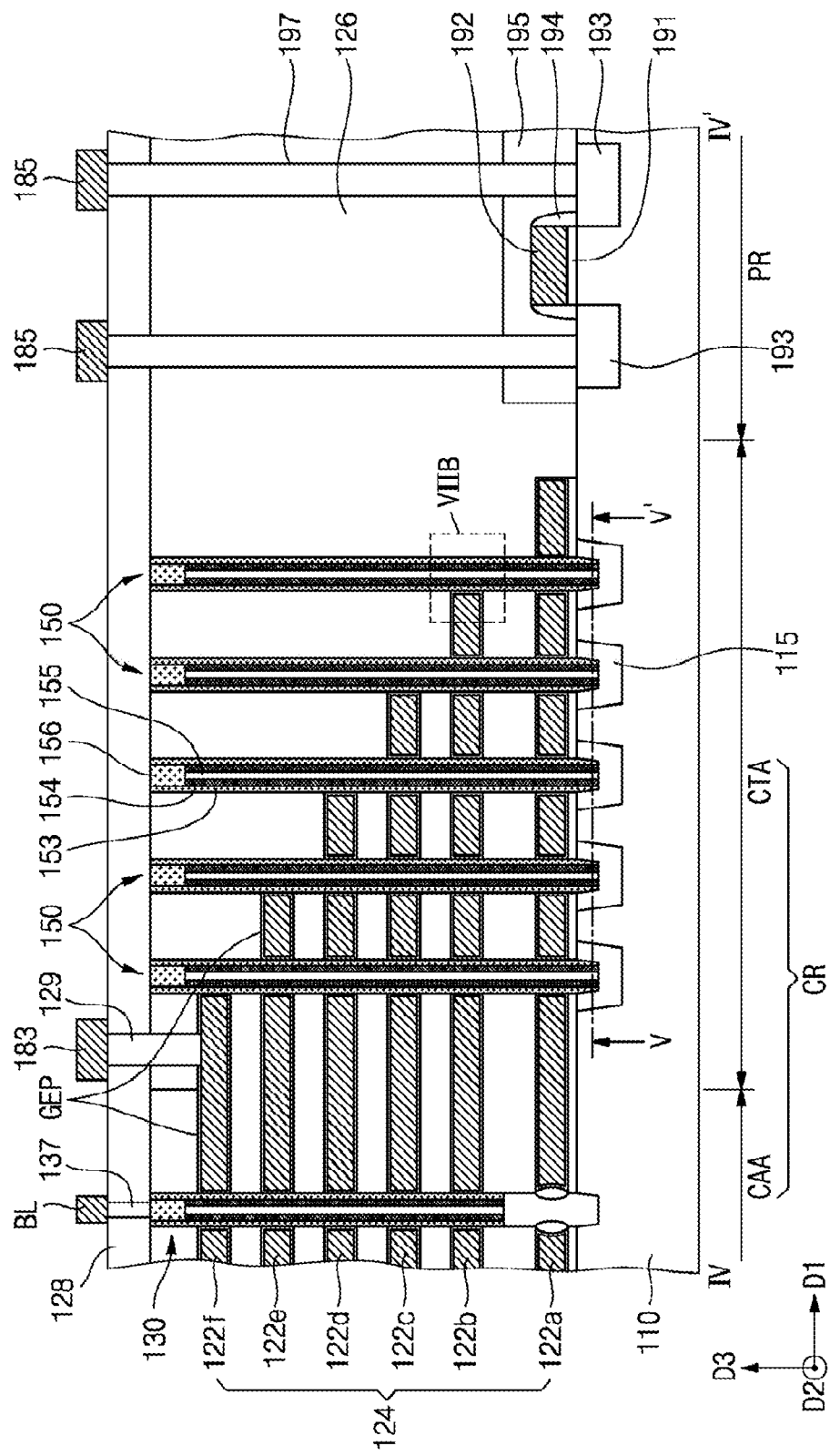
FIG. 4 is a vertical cross-sectional view taken along line IV-IV' of FIG. 2.
Figure 5:
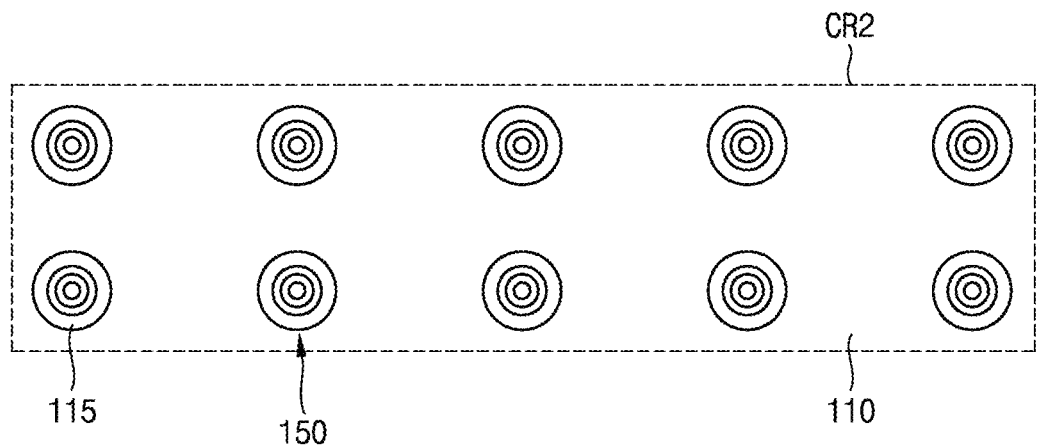
FIG. 5 is a horizontal cross-sectional view taken along line V-V' of FIG. 4.
Figure 6:
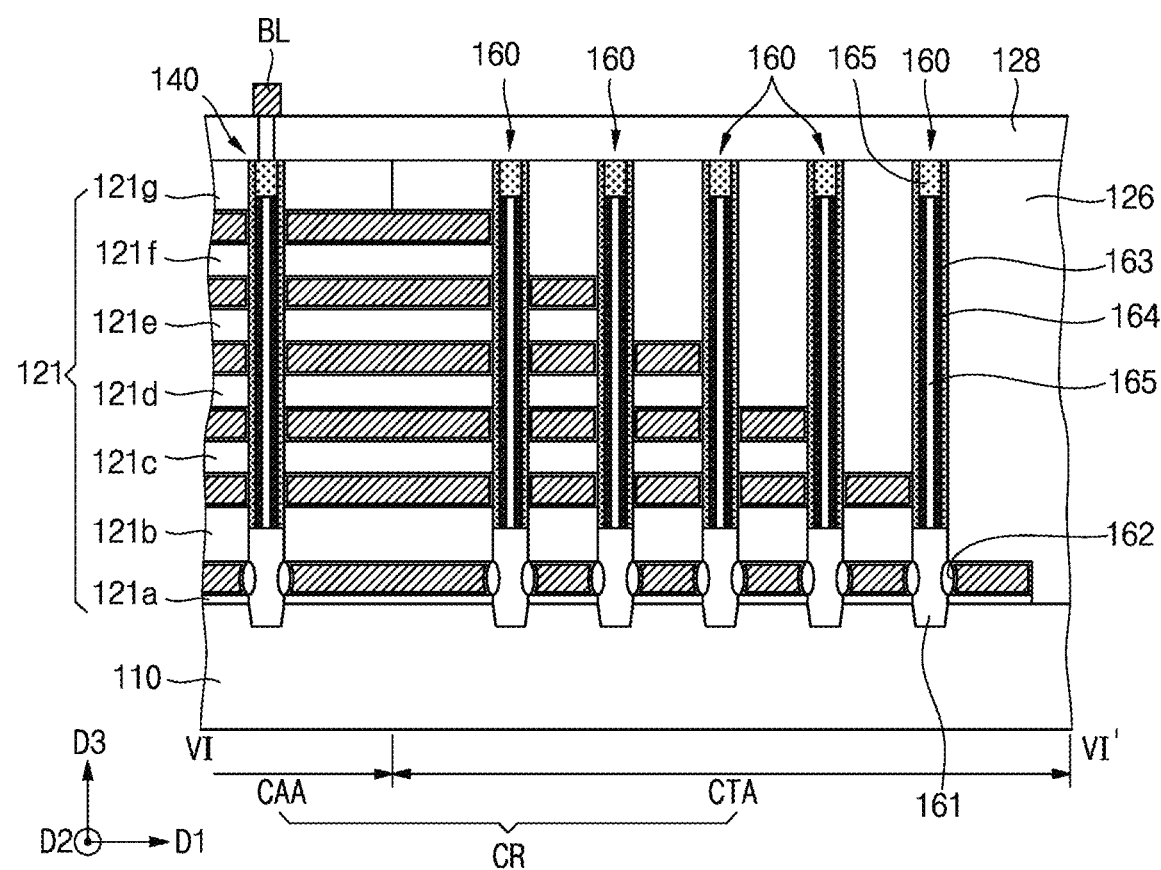
FIG. 6 is a vertical cross-sectional view taken along line VI-VI' of FIG. 2.
Figure 7A:
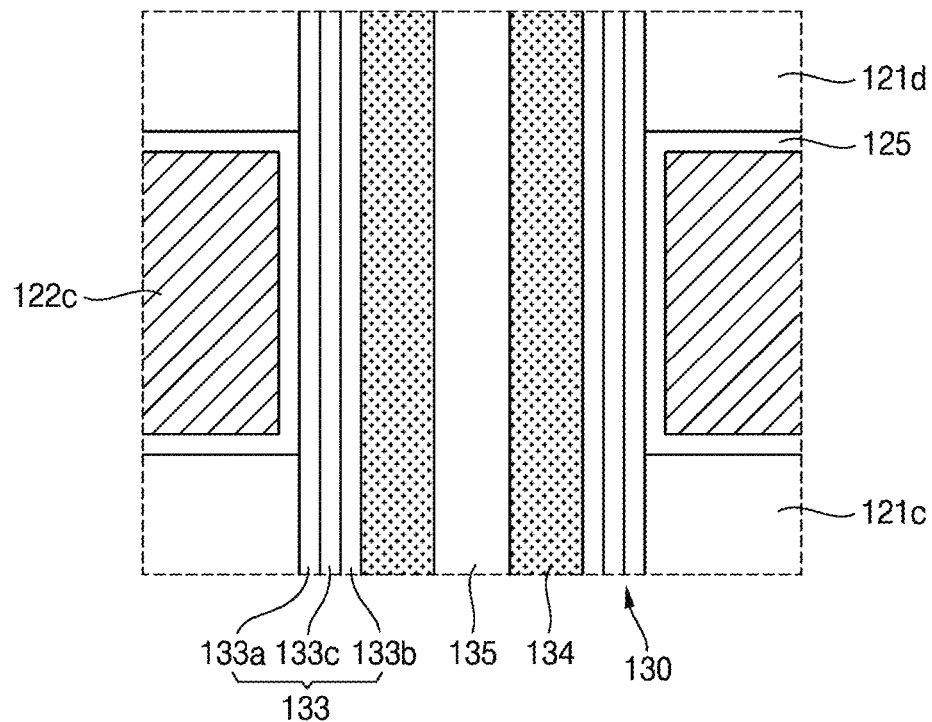
FIG. 7A is an enlarged view of a part VIIA of FIG. 3.
Figure 7B:
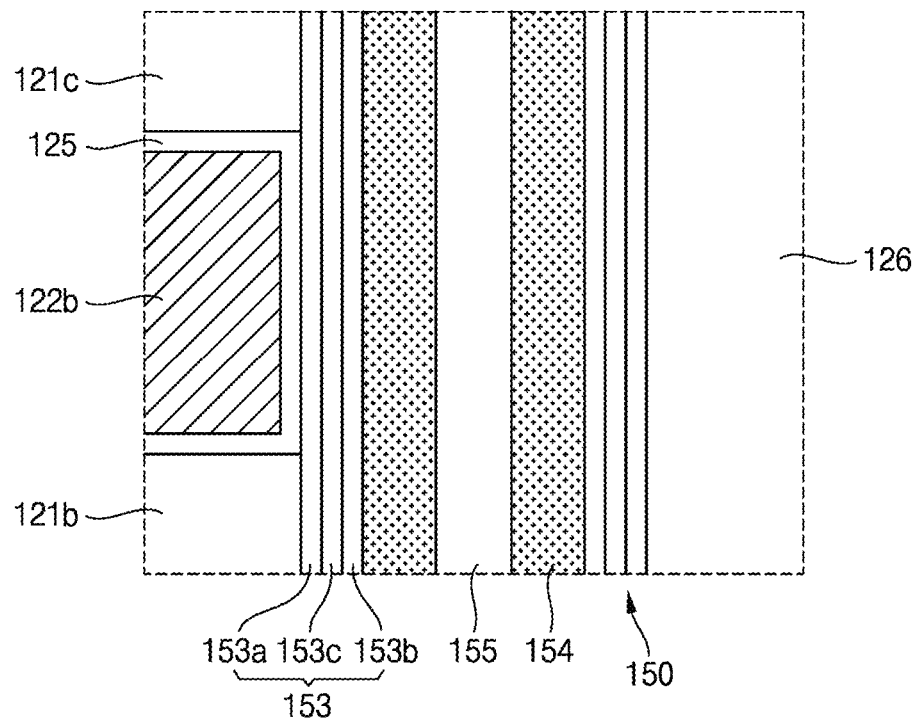
FIG. 7B is an enlarged view of a part VIIB of FIG. 4.
Figure 8:
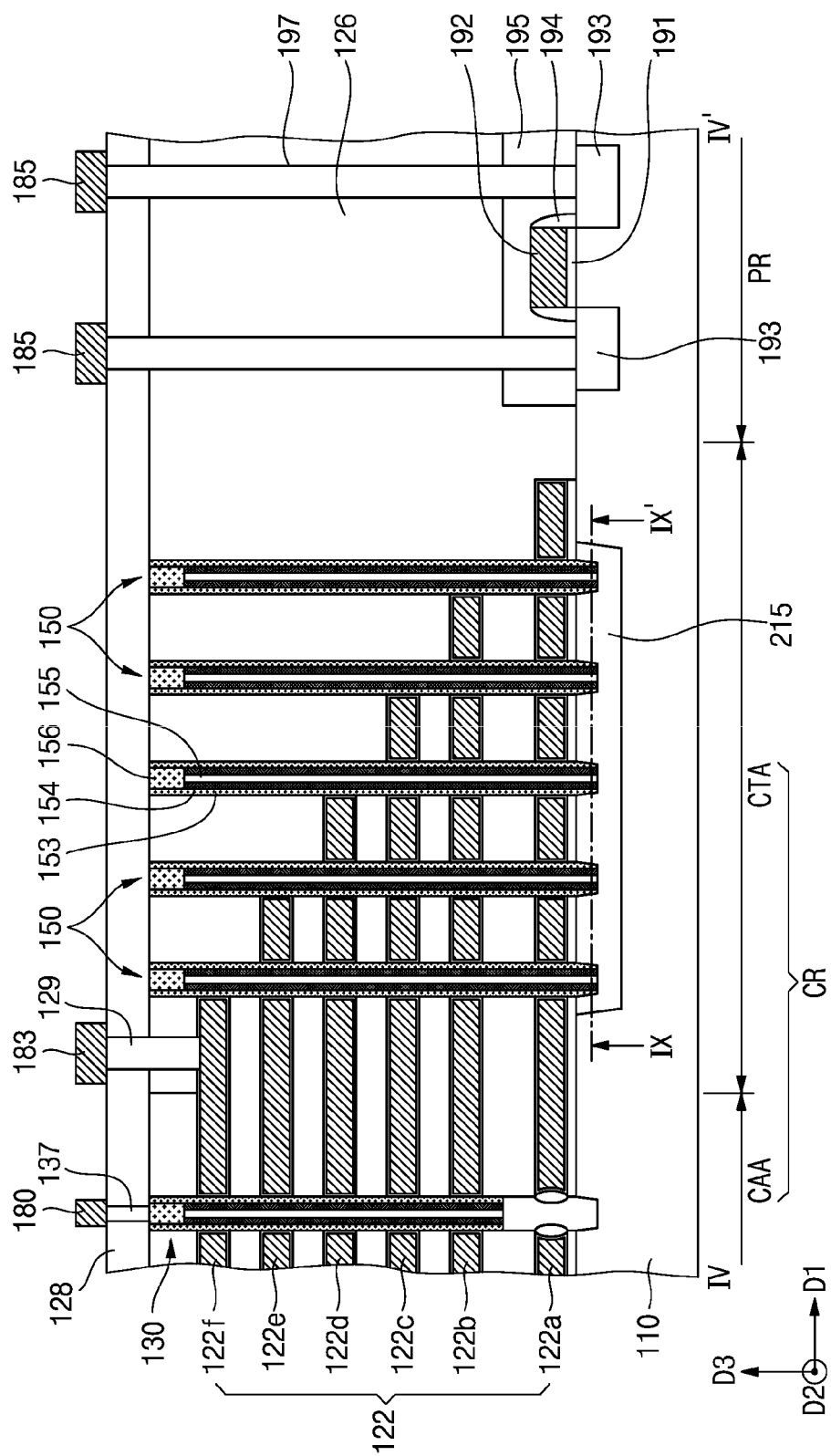
FIG. 8 is a vertical cross-sectional view corresponding to FIG. 4, according to an example embodiment of inventive concepts.
Figure 9:
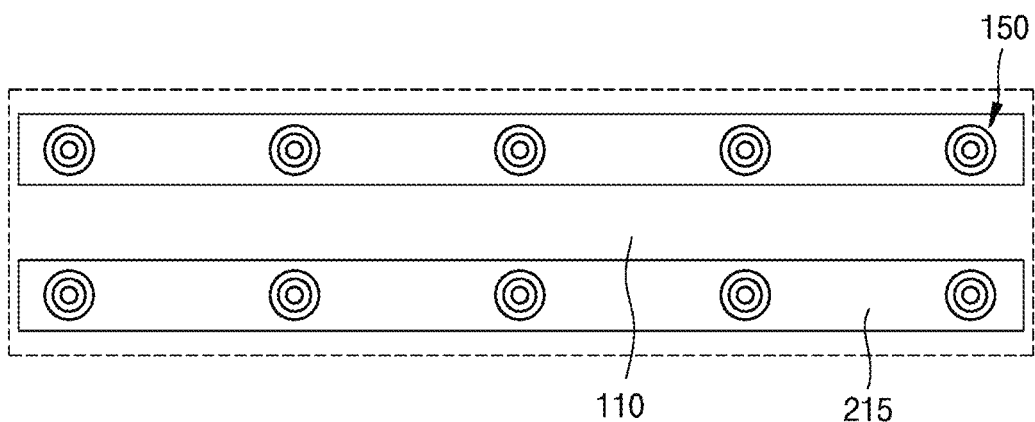
FIG. 9 is a horizontal cross-sectional view taken along line IX-IX' of FIG. 8.
Figure 10:
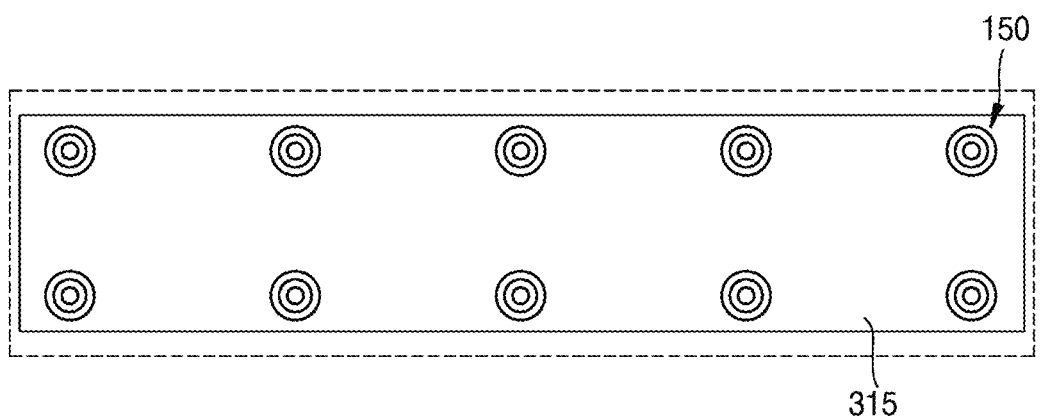
FIG. 10 is a horizontal cross-sectional view corresponding to FIG. 9, according to an example embodiment of inventive concepts.
Figure 11:
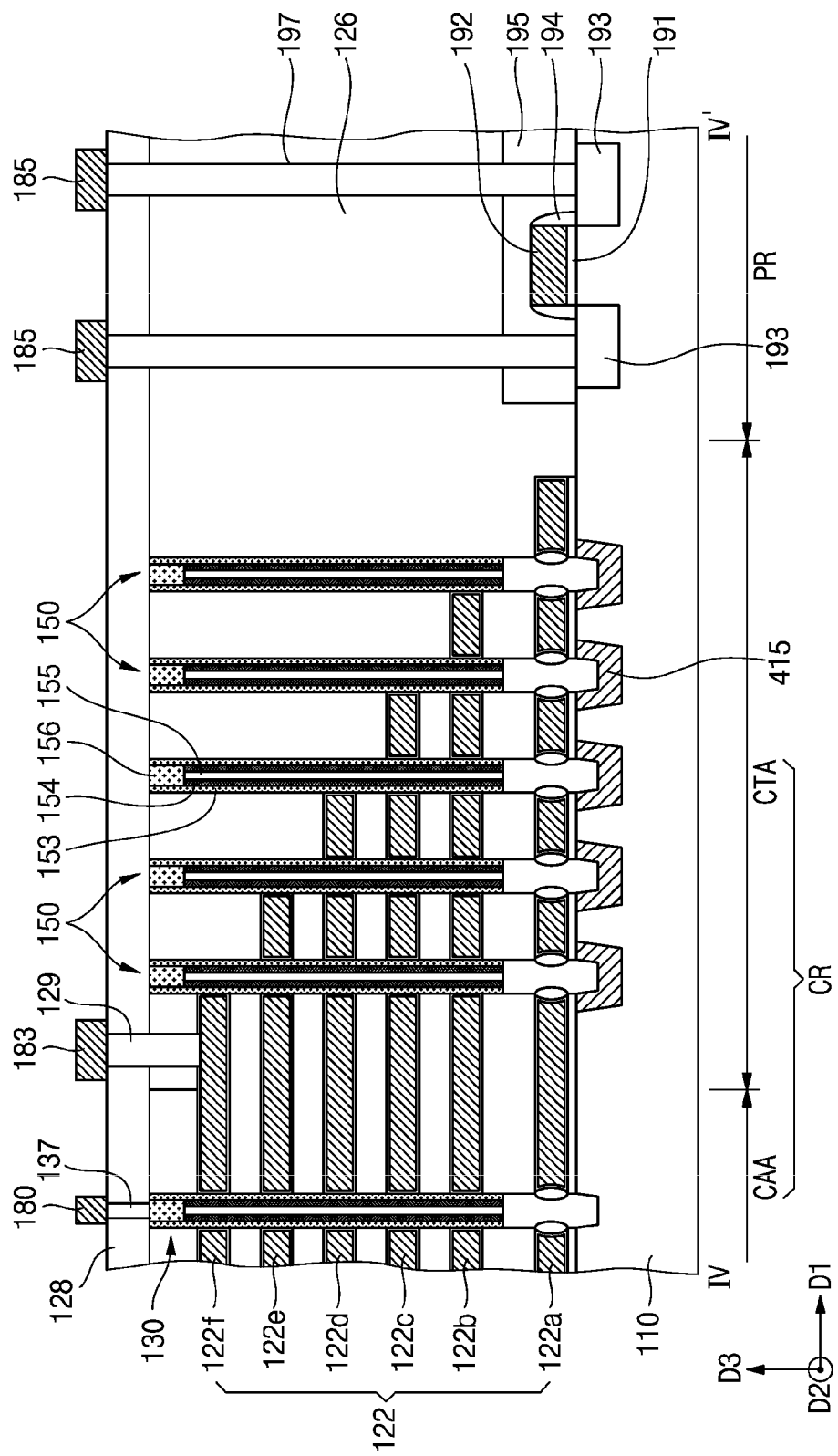
FIG. 11 is a vertical cross-sectional view corresponding to FIG. 4, according to an example embodiment of inventive concepts.
Figure 12:
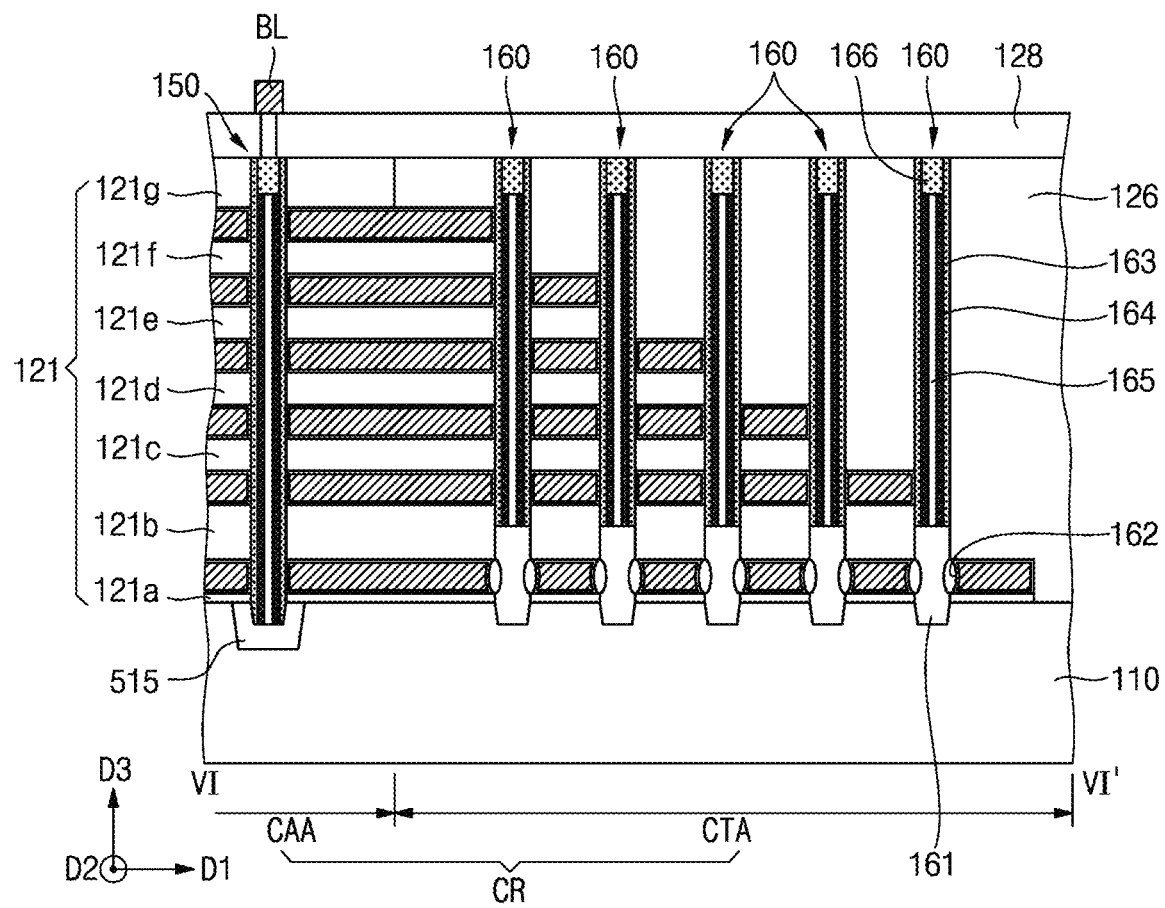
FIG. 12 is a vertical cross-sectional view corresponding to FIG. 6, according to an example embodiment of inventive concepts.

FIG. 1 is a schematic block diagram of a semiconductor memory device according to an example embodiment of inventive concepts. FIG. 2 is a plan view of a part II of FIG. 1. FIG. 3 is a vertical cross-sectional view taken along line III-III' of FIG. 2. FIG. 4 is a vertical cross-sectional view taken along line IV-IV' of FIG. 2. FIG. 5 is a horizontal cross-sectional view taken along line V-V' of FIG. 4. FIG. 6 is a vertical cross-sectional view taken along line VI-VI' of FIG. 2. FIG. 7A is an enlarged view of a part VIIA of FIG. 3. FIG. 7B is an enlarged view of a part VIIB of FIG. 4. FIG. 8 is a vertical cross-sectional view corresponding to FIG. 4, according to an example embodiment of inventive concepts. FIG. 9 is a horizontal cross-sectional view taken along line IX-IX' of FIG. 6. FIG. 10 is a horizontal cross-sectional view corresponding to FIG. 9, according to an example embodiment of inventive concepts. FIG. 11 is a vertical cross-sectional view corresponding to FIG. 4, according to an example embodiment of inventive concepts. FIG. 12 is a vertical cross-sectional view corresponding to FIG. 6, according to an example embodiment of inventive concepts.

Referring to FIGS. 1 to 12, a semiconductor memory device according to an example embodiment of inventive concepts includes a substrate 110, an isolation layer 115, a stack structure 120, a first cell channel structure 130, a second cell channel structure 140, a first dummy channel structure 150, a second dummy channel structure 160, and a common source line (CSL) 170. The semiconductor memory device may further include a bit line BL, a first metal line 183, and a second metal line 185. The semiconductor memory device may further include at least one peripheral circuit element 190. The semiconductor memory device may be a three-dimensional (3D) memory device. For example, the semiconductor memory device may be a 3D NAND flash memory device.

According to an example embodiment, a first direction D1 may refer to a direction from a cell array region CAA to a connection region CTA, a second direction D2 may refer to a horizontal direction perpendicular to the first direction D1, and a third direction D3 may refer to a vertical direction perpendicular to both the first direction D1 and the second direction D2. According to an example embodiment, the first cell channel structure 130, the second cell channel structure 140, the first dummy channel structure 150, and the second dummy channel structure 160 may be collectively referred to as channel structures. The first cell channel structure 130 and the second cell channel structure 140 may be collectively referred to as cell channel structures. The first dummy channel structure 150 and the second dummy channel structure 160 may be collectively referred to as dummy channel structures.

The semiconductor memory device may include a cell region CR and a peripheral circuit region PR. The cell region CR may include the cell array region CAA, and a connection region CTA adjacent to the cell array region CAA.

The cell region CR may include cell blocks CB and dummy blocks DB. The cell region CR may include first blocks and second blocks. The first blocks may be the cell blocks CB, and the second blocks may be the dummy blocks DB. Each of the cell blocks CB and the dummy blocks DB may include a cell array region CAA and a connection region CTA. Each of the cell blocks CB and the dummy blocks DB may be formed over the cell array region CAA and the connection region CTA. The cell blocks CB may be located at inner sides of the cell region CR. The dummy blocks DB may be located at outer sides of the cell region CR. Further, the dummy blocks DB also may be located between cell blocks CB at inners side of the cell region CR. Here, the cell blocks CB may refer to blocks in which memory cells formed in the cell array region CAA store data. The dummy blocks DB may refer to blocks in which memory cells formed in the cell array region CAA do not store data. A circuit for storing data may not be formed in the dummy blocks DB. The dummy blocks DB may include a test logic or circuits related to the test logic.

The cell region CR may be divided into four regions: a first region which corresponds to both the cell blocks CB and the cell array region CAA; a second region which corresponds to both the cell blocks CB and the connection region CTA; a third region which corresponds to both the dummy blocks DB and the cell array region CAA; and a fourth region which corresponds to both the dummy blocks DB and the connection region CTA. The cell region CR may include a common source region 111 located between the cell blocks CB or between the cell block CB and the dummy block DB.

The cell array region CAA may include memory cells arranged in an array. In the cell region CR, a bit contact 137 and a bit line BL may be located. In the connection region CTA, a gate contact 129 and the first metal line 183 may be located. In a peripheral circuit region PR, peripheral contacts 197 and the second metal line 185 may be located.

In the peripheral circuit region PR, peripheral circuits which include the at least one peripheral circuit element 190 and are configured to drive a memory cell and read data stored in the memory cell may be located. For example, in the peripheral circuit region PR, a wordline driver, a sense amplifier, a row decoder, a column decoder, and/or control circuits may be located.

The substrate 110 may include a semiconductor material. For example, the substrate 110 may be a silicon (Si) single crystal substrate, a germanium (Ge) single crystal substrate, or a silicon-germanium (SiGe) single crystal substrate. The substrate 110 may be a P type semiconductor substrate. The substrate 110 may include a P type impurity (e.g., boron (B), gallium (Ga), or indium (In)). The substrate 110 is, however, not limited to the P type semiconductor substrate. The substrate 110 may be a silicon-on-insulator (SOI) substrate. The substrate 110 may include a semiconductor active-layer (e.g., a silicon layer, a silicon-germanium layer, or a germanium layer) on an insulating layer protecting transistors provided on a semiconductor substrate. The substrate 110 may include a well region (not shown).

The substrate 110 may include the common source region 111. The common source region 111 may be formed in the substrate 110 in a region between the cell blocks CB and a region between the cell block CB and the dummy block DB. The common source region 111 may extend in the substrate 110 in the first direction D1. The common source region 111 may include an N type impurity (e.g., arsenic (As) or phosphor (P)).

The isolation layer 115 may be formed on the substrate 110, for example, in the connection region CTA of the dummy block DB, at which the first dummy channel structure 150 is provided. The isolation layer 115 may have a shape of a block or a pillar having a desired (or alternatively, predetermined) height. A plurality of isolation layers 115 may be independently located below all first dummy channel structures 150. At least two isolation layers 115 may be integrally provided along the second direction D2.

The isolation layer 115 may prevent the first dummy channel structure 150 from being in direct contact with the substrate 110. The isolation layer 115 may electrically insulate the first dummy channel structure 150 from the substrate 110. The isolation layer 115 may block an electric charge supplied to the first dummy channel structure 150 from leaking to the substrate 110.

The isolation layer 115 may be formed by filling an insulating material into a groove, which is defined to have a desired (or alternatively, predetermined) depth and area from a top surface of the substrate 110 to a bottom surface thereof. The isolation layer 115 may be formed to have a height greater than a depth of the first cell channel structure 130 from the top surface of the substrate 110 toward the bottom surface of the substrate 110. A groove may be formed in a top surface of the isolation layer 115 to have a shape corresponding to a shape of a portion of the first cell channel structure 130 inserted into the substrate 110. The isolation layer 115 may have a diameter greater than that of the first dummy channel structure 150.

The isolation layer 115 may include, for example, a silicon oxide, a silicon nitride, a silicon oxynitride, an aluminum oxide, or a mixture thereof. The isolation layer 115 may include an insulating material having an electrical insulation property.

According to an example embodiment illustrated in FIGS. 8 and 9, an isolation layer 215 may have a bar shape and provided under two or more of a plurality of first dummy channel structures 150, which are provided in a connection region CTA of the cell block CB and are spaced apart from each other in the first direction D1. The isolation layer 215 may be integrally formed under an entirety of the plurality of first dummy channel structures 150, which are spaced apart from each other in the first direction D1. In some example embodiments, isolation layers 215 may be provided in a plurality of bar shapes, which are spaced apart from each other in the second direction D2.

According to an example embodiment illustrated in FIG. 10, an isolation layer 315 may have a plate shape under two or more a plurality of first dummy channel structures 150 (which are spaced apart from each other in the first direction D1 and the second direction D2) formed in the connection region CTA of the cell block CB. The isolation layer 315 may be integrally formed under an entirety of the plurality of first dummy channel structures 150 (which are spaced apart from each other in the first direction D1 and the second direction D2) formed in the connection region CTA of the cell block CB.

According to an example embodiment illustrated in FIG. 11, a concentration of an impurity of an isolation layer 415 may be higher than that of an impurity of the substrate 110. When the substrate 110 is a P type semiconductor substrate, the isolation layer 415 may include a P+ epitaxial pattern. The isolation layer 415 may be an ion-implanted layer obtained by implanting a P type impurity by ion implantation. When the concentration of the P type impurity of the isolation layer 415 is higher than that of a P type impurity of the substrate 110, an electric charge supplied above the first dummy channel structure 150 may be mitigated or prevented from leaking to the substrate 110.

According to an example embodiment illustrated in FIG. 12, an isolation layer 515 may be additionally formed on the substrate 110, for example, in the cell array region CAA of the dummy block DB, at which the second cell channel structure 140 is formed. The isolation layer 515 may prevent the second cell channel structure 140 and the substrate 110 from being electrically connected to each other.

The stack structure 120 includes a plurality of interlayer insulating layers 121 and a plurality of gate electrodes 122. The stack structure 120 may further include a gate blocking insulation film 125, a mold insulating layer 126, an upper insulating layer 128, and a gate contact 129.

The stack structure may be formed by alternately stacking the interlayer insulating layers 121 (121a, 121b, 121c, 121d, 121e, 121f, and 121g) and the gate electrodes 122 (122a, 122b, 122c, 122d, 122e, and 1220) in the third direction D3. The stack structure 120 may be formed in the cell region CR and extend from the cell array region CAA to the connection region CTA. The stack structure 120 may extend in the first direction D1 to be parallel to a surface of the substrate 110. The gate electrodes 122 may be insulated from one another by the interlayer insulating layers 121 interposed between the gate electrodes 122.

The stack structures 120 may be separated from each other in units of cell blocks CB or in units of dummy blocks DB. The stack structures 120 may be separated from each other by the common source line CSL 170, which is located between cell blocks CB or between the cell block CB and the dummy block DB. The stack structures 120 may be separated from each other in the second direction D2, which is perpendicular to the first direction D1 and parallel to the surface of the substrate 110.

The stack structure 120 may have stepped end parts in the connection region CTA. The gate electrodes 122 may extend to different lengths from the cell array region CAA. For example, the lengths of the gate electrodes 122 extending from the cell array region CAA may become shorter from bottom to top. Among the gate electrodes 122, a lowermost one of the gate electrode 122a may have a longest length, and an uppermost one of the gate electrodes 122f may have a shortest length. Each of the gate electrodes 122 may include a gate pad part GEP, which is exposed in an upward direction, in the connection region CTA.

The interlayer insulating layers 121 may have different thicknesses. For example, the interlayer insulating layer 121a, which is a lowermost one among the interlayer insulating layers 121, may be thinner than the other interlayer insulating layers 121b, 121c, 121d, 121e, 121f, and 121g. The interlayer insulating layer 121a, which is the lowermost one from among the interlayer insulating layers 121, may be located between the substrate 110 and the gate electrode 122a, which is the lowermost one from among the gate electrodes 122. The interlayer insulating layer 121b, which is a second one from among the interlayer insulating layers 121 from the substrate 110, and the interlayer insulating layer 121g, which is the uppermost one from among the interlayer insulating layers 121, may be thicker than the other of the interlayer insulating layers 121c, 121d, 121e, and 121f. The interlayer insulating layers 121 may include an insulating material (e.g., a silicon oxide film, a silicon nitride film, or a silicon oxynitride film).

The gate electrodes 122 may have the same thickness or different thicknesses. The gate electrodes 122 may be spaced the same distance or different distances apart from one another in the third direction D3. The gate electrode 122a, which is the lowermost one from among the gate electrodes, and the gate electrodes 122b located on the gate electrode 122a may be spaced a first distance apart, and each of the neighboring ones from among the other gate electrodes 122c, 122d, 122e, and 122f may be spaced a second distance apart. The first distance may be larger than the second distance. The gate electrodes 122 may be insulated from one another by the interlayer insulating layers 121 interposed therebetween.

The gate electrodes 122 may include a conductive film. For example, the gate electrodes 122 may include one film selected among a semiconductor film (e.g., an impurity-doped silicon film), a metal silicide film (e.g., a cobalt silicide film, a nickel silicide film, a titanium silicide film, a tungsten silicide film, or a tantalum silicide film), a metal nitride film (e.g., a titanium nitride film, a tungsten nitride film, or a tantalum nitride film), a metal film (e.g., a tungsten film, a nickel film, a cobalt film, a titanium film, a ruthenium film, or a tantalum film), and a mixture thereof.

The gate electrodes 122 may be used as control gate electrodes of memory cells arranged in an array in the cell array region CAA. The gate electrodes 122 may be combined with the first cell channel structure 130 to form memory cells. Thus, a vertical memory cell string including memory cells arranged vertically may be formed in the cell array region CAA. The gate electrode 122f, which is the uppermost one from among the gate electrodes 122, may be used as a gate electrode of a string selection transistor for controlling an electrical connection between the bit line BL and the first cell channel structure 130. The gate electrode 122a which is the lowermost gate electrode may be used as a gate electrode of a ground selection transistor for controlling an electrical connection between the common source region 111 and the first cell channel structure 130.

The gate blocking insulation film 125 may be formed on an outer surface of each of the gate electrodes 122. The gate blocking insulation film 125 may be formed on a top surface, a bottom surface, and side surfaces of the gate electrodes 122. The gate blocking insulation film 125 may cover the outer surfaces of the gate electrodes 122. The gate blocking insulation film 125 may be formed between the gate electrodes 122 and the interlayer insulating layers 121 and between the gate electrodes 122 and the channel structures. The gate blocking insulation film 125 may not be formed when the gate electrodes 122 are sufficiently electrically insulated from one another. The gate blocking insulation film 125 may be formed in one thin film or multiple thin films. The gate blocking insulation film 125 may include a high-K dielectric film (e.g., an aluminum oxide film and/or a hafnium oxide film).

The mold insulating layer 126 may be provided in the connection region CTA and the peripheral circuit region PR. The mold insulating layer 126 may cover end parts (e.g., the gate pad parts GEP) of the gate electrodes 122. The mold insulating layer 126 may cover the at least one peripheral circuit element 190. A top surface of the mold insulating layer 126 may be coplanar with a top surface of the interlayer insulating layer 121g, which is the uppermost one from among the interlayer insulating layers 121. The mold insulating layer 126 may include, for example, an oxide film, a nitride film, or a low-K dielectric film.

The upper insulating layer 128 may be formed on the cell array region CAA, the connection region CTA, and the peripheral circuit region PR. The upper insulating layer 128 may be formed on the interlayer insulating layers 121 and the mold insulating layer 126. The upper insulating layer 128 may cover top surfaces of the channel structure. The upper insulating layer 128 may cover the common source line CSL 170. The upper insulating layer 128 may include, for example, an oxide film or a nitride film.

The gate contact 129 may formed to extend upward from a top surface of the gate pad part GEP of each of the gate electrodes 122. The gate contact 129 may pass through the mold insulating layer 126 and the upper insulating layer 128 to be exposed at the top of the upper insulating layer 128. The gate contact 129 may be electrically connected to the gate pad parts GEP of the gate electrodes 122. A height of the gate contact 129 may increase as the distance between the gate contact 129 and the cell array region CAA increases.

The first cell channel structure 130 may include a first cell semiconductor pattern 131, a first cell data storing pattern 133, and a first cell channel pattern 134. The first cell channel structure 130 may further include a first cell-embedded insulating pattern 135, a first cell pattern oxide film 132, a first cell conductive pattern 136, and a bit contact 137. The first cell channel structure 130 may be located in the cell array region CAA of the cell block CB.

The first cell channel structure 130 may pass through the stack structure 120, which is in contact with the substrate 110 while extending in the third direction D3. The first cell channel structure 130 may vertically pass through the gate electrodes 122 and the interlayer insulating layers 121 such that the first cell channel structure 130 is in contact with the substrate 110. A plurality of first cell channel structures 130 may be arranged in the cell array region CAA of the cell block CB in the first direction D1 and in the second direction D2. The plurality of first cell channel structures 130 may be arranged in a zigzag pattern in the first direction D1 and arranged adjacent to each other in the second direction D2. According to an example embodiment, the plurality of first cell channel structures 130 may be arranged in two rows such that first cell channel structures 130 are arranged in the zigzag pattern in the first direction D1 and are repeatedly arranged in the zigzag pattern in the second direction D2.

The first cell semiconductor pattern 131 may be located at the bottom of the first cell channel structure 130. The first cell semiconductor pattern 131 may be in direct contact with the substrate 110 while extending to the inside of the substrate 110. The first cell semiconductor pattern 131 is electrically connected to the substrate 110. The first cell semiconductor pattern 131 may have a cylindrical pillar shape, a part of which is embedded in the substrate 110 and the other part of which vertically protrudes from the top surface of the substrate 110. A top surface of the first cell semiconductor pattern 131 may have various shapes. For example, the top surface of the first cell semiconductor pattern 131 may have a flat shape, a shape inclined with respect to the substrate 110, a horn shape, or a truncated shape.

The first cell semiconductor pattern 131 may have a first protrusion height which is a height of the part thereof protruding from the top surface of the substrate 110. The first protrusion height may be greater than a height from the top surface of the substrate 110 to a top surface of the gate electrode 122a, which is the lowermost one from among the gate electrodes 122. The first protrusion height may be less than a height from the top surface of the substrate 110 to a top surface of the second lowermost one 121b of the interlayer insulating layers 121. The top surface of the first cell semiconductor pattern 131 may be at a higher level than that of the gate electrode 122a, which is the lowermost one from among the gate electrodes 122, and be at a lower level than that of the interlayer insulating layer 121b, which is the second lowermost one from among the interlayer insulating layers 121.

The first cell semiconductor pattern 131 may include silicon (Si). The first cell semiconductor pattern 131 may be an epitaxial pattern including single crystal silicon or polycrystalline silicon. The first cell semiconductor pattern 131 may be formed by a selective epitaxial growth process using the top surface of the substrate 110 as a seed layer. The first cell semiconductor pattern 131 may not be formed on the isolation layer 115. The first cell semiconductor pattern 131 may include, for example, germanium (Ge), silicon germanium (SiGe), a III-V group semiconductor compound, or a II-VI group semiconductor compound. The first cell semiconductor pattern 131 may be an undoped pattern or a pattern doped with an impurity having the same conductivity type as that of the substrate 110.

The first cell pattern oxide film 132 may be located between the gate electrode 122a, which is the lowermost one from among the gate electrodes 122, and the first cell semiconductor pattern 131. The first cell pattern oxide film 132 may be formed in a ring shape on an outer circumferential surface of the first cell semiconductor pattern 131. The first cell pattern oxide film 132 may have a convex shape. The first cell pattern oxide film 132 may be formed by oxidizing the outer circumferential surface of the first cell semiconductor pattern 131. The first cell pattern oxide film 132 may be a thermal oxide film. The first cell pattern oxide film 132 may include a silicon oxide film. A part of the first cell semiconductor pattern 131 may be changed to have a concave outer circumference shape during a process of forming the first cell pattern oxide film 132. For example, a part of the outer circumferential surface of the first cell semiconductor pattern 131 may be changed to a concave shape due to formation of the first cell pattern oxide film 132.

The first cell data storing pattern 133 may be arranged on the top surface of the first cell semiconductor pattern 131 and extend in the third direction D3. The first cell data storing pattern 133 may have a pipe shape, the inside of which is hollow. The first cell data storing pattern 133 may have a shape, the top and bottom ends of which are open. The first cell data storing pattern 133 may be formed so that an outer surface thereof faces the stack structure 120. The first cell data storing pattern 133 may include a thin film for storing data. For example, the first cell data storing pattern 133 may be configured to change data stored therein according to a voltage difference between the first cell channel structure 130 and the gate electrodes 122 or the Fowler-Nordheim tunneling effect caused by the voltage difference, but inventive concepts are not limited thereto. The first cell data storing pattern 133 may include a thin film for storing data on the basis of a different operating principle (e.g., a thin film for a phase-change memory device or a thin film for a variable-resistance memory device).

As illustrated in FIGS. 7A and 7B, the first cell data storing pattern 133 may include a first cell outer insulating film 133a, which is located at an outer side of the first cell data storing pattern 133 and is adjacent to the gate electrodes 122, a first cell inner insulating film 133b, which is located at an inner side of the first cell data storing pattern 133 and is in contact with the first cell channel pattern 134, and a first cell charge storage film 133c located between the first cell outer insulating film 133a and the first cell inner insulating film 133b. The first cell outer insulating film 133a may include a silicon oxide film and/or a high-K dielectric film (e.g., an aluminum oxide film or a hafnium oxide film). The first cell inner insulating film 133b may include a silicon oxide film. The first cell charge storage film 133c may include a silicon nitride.

The first cell channel pattern 134 may be provided on the top surface of the first cell semiconductor pattern 131 and extend in the third direction D3. The first cell channel pattern 134 may be formed in a pipe shape, the inside of which is hollow. The first cell channel pattern 134 may have a macaroni shape, the inside of which is hollow. The first cell channel pattern 134 may have a shape, the top and bottom ends of which are open. The first cell channel pattern 134 may have a shape, the top end of which is open. The first cell channel pattern 134 may be in contact with the first cell semiconductor pattern 131. An outer circumferential surface of the first cell channel pattern 134 may be in contact with an inner circumferential surface of the first cell data storing pattern 133. The first cell channel pattern 134 may be electrically connected to the first cell semiconductor pattern 131. The first cell channel pattern 134 may be electrically connected to the substrate 110 via the first cell semiconductor pattern 131. According to an example embodiment, the first cell channel pattern 134 may be formed in a cylindrical shape. In this case, the first cell channel structure 130 may not include the first cell-embedded insulating pattern 135.

The first cell channel pattern 134 may include, for example a polycrystalline semiconductor material, an amorphous semiconductor material, or a single crystal semiconductor material. The first cell channel pattern 134 may include at least one among silicon (Si), germanium (Ge), silicon germanium (SiGe), gallium arsenic (GaAs), indium gallium arsenic (InGaAs), aluminum gallium arsenic (Al-GaAs), and a mixture thereof. The first cell channel pattern 134 may include a semiconductor material which is not doped with an impurity or a semiconductor material doped with an impurity of the same conductivity type as that of the substrate 110.

The first cell-embedded insulating pattern 135 may be provided on the top surface of the first cell semiconductor pattern 131 and extend in the third direction D3. The first cell-embedded insulating pattern 135 may fill an empty space inside the first cell channel pattern 134. The first cell-embedded insulating pattern 135 may be formed in a cylindrical shape. An outer circumferential surface of the first cell-embedded insulating pattern 135 may be in contact with the first cell channel pattern 134. The first cell-embedded insulating pattern 135 may include, for example, a silicon oxide film or a silicon nitride film.

The first cell conductive pattern 136 may be located on the first cell channel pattern 134. The first cell conductive pattern 136 may be located on the first cell-embedded insulating pattern 135. The first cell conductive pattern 136 may extend from a top portion of the first cell data storing pattern 133. The first cell conductive pattern 136 may include a conductive material. The first cell conductive pattern 136 may include an impurity-doped impurity region. The first cell conductive pattern 136 provided at one end of the first cell channel structure 130 may function as a drain region.

The bit contact 137 may extend upward from a top surface of the first cell conductive pattern 136. The bit contact 137 may pass through the upper insulating layer 128, and thus be exposed at a top surface of the upper insulating layer 128. The bit contact 137 may be electrically connected to the first cell conductive pattern 136. The bit contact 137 may be electrically connected to the bit line BL. The bit contact 137 may electrically connect the first cell conductive pattern 136 and the bit line BL to each other. The bit contact 137 may include a conductive material (e.g., doped silicon, a metal silicide, or a metal).

The second cell channel structure 140 may include a second cell semiconductor pattern 141, a second cell channel pattern 144, and a second cell data storing pattern 143. The second cell channel structure 140 may further include a second cell-embedded insulating pattern 145, a second cell pattern oxide film 142, and a second cell conductive pattern 146. The second cell channel structure 140 is located in the third region, which is the cell array region CAA of the dummy block DB.

The second cell channel structure 140 may be formed to be the same as the first cell channel structure 130, except that the second cell channel structure 140 is formed at a different location and is not electrically connected to the bit line BL. The second cell channel structure 140 may be located at an outermost side of the cell region CR. Accordingly, the second cell channel structure 140 is not electrically connected to the bit line BL and thus may not serve as a memory cell. The second cell channel structure 140 formed in the cell array region CAA of the dummy block DB may function as a support to the stack structure 120.

The second cell semiconductor pattern 141 may be formed to be the same as or similar to the first cell semiconductor pattern 131. The second cell pattern oxide film 142 may be formed to be the same as or similar to the first cell pattern oxide film 132. The second cell data storing pattern 143 may be formed to be the same as or similar to the first cell data storing pattern 133. The second cell channel pattern 144 may be formed to be the same as or similar to the first cell channel pattern 134. The second cell-embedded insulating pattern 145 may be formed to be the same as or similar to the first cell-embedded insulating pattern 135. The second cell conductive pattern 146 may be formed to be the same as or similar to the first cell conductive pattern 136.

According to an example embodiment, referring to FIG. 12, at least some second cell channel structures 140 may implement the first dummy channel structures 150. The first dummy channel structures 150 may be formed on locations of the second cell channel structures 140 in the cell array region CAA of the dummy block DB. The substrate 110 may include the isolation layer 515 on the location of each of the first dummy channel structures 150 in the cell array region CAA of the dummy block DB. The first dummy channel structure 150 may be electrically insulated from the substrate 110 by the isolation layer 515. The second cell channel structure 140 located in the second region may not be electrically connected to the bit line BL. Thus, the second cell channel structure 140 may be provided not to provide an electrical connection between the bit line BL and the substrate 110. Thus, the second cell channel structure 140 may implement the first dummy channel structure 150 so that a channel structure located in the cell array region CAA of the dummy block DB may be electrically insulated from the substrate 110.

The first dummy channel structure 150 may include a first dummy data storing pattern 153 and a first dummy channel pattern 154. The first dummy channel structure 150 may further include a first dummy-embedded insulating pattern 155 and a first dummy conductive pattern 156. The first dummy channel structure 150 may be in direct contact with the isolation layer 115. The first dummy channel structure 150 may have the same shape as or a similar shape to that of the first cell channel structure 130. However, the first dummy channel structure 150 may be in direct contact with the isolation layer 115 unlike the first cell channel structure 130, and thus the first cell semiconductor pattern 131 formed by epitaxial growth may not be provided. Thus, in the first dummy channel structure 150, the first dummy data storing pattern 153, the first dummy channel pattern 154, and the first dummy-embedded insulating pattern 155 may extend to the isolation layer 115, and thus be thus in direct contact with the isolation layer 115. According to an example embodiment, the first dummy channel structure 150 may extend to the inside of the isolation layer 115. A lower part of the first dummy channel structure 150 may be embedded into the isolation layer 115.

A top surface of the first dummy channel structure 150 and a top surface of the first cell channel structure 130 may be at the same height. A bottom surface of the first dummy channel structure 150 and a bottom surface of the first cell channel structure 130 may be at the same height, or at different heights.

The first dummy channel structure 150 may be located in the second region corresponding to both the cell block CB and the connection region CTA. A plurality of first dummy channel structures 150 may be located in the second region, and are spaced apart from one another in the first direction D1. According to an example embodiment, a number of first dummy channel structures 150 corresponding to the number of the gate electrodes 122 except the gate electrode 122a, which is the lowermost one from among the gate electrodes 122, may be arranged in a row in the first direction D1. According to an example embodiment, at least two first dummy channel structures 150 may be arranged in two or more rows to be spaced apart from each other in the second direction D2.

The first dummy channel structures 150 may extend in the third direction D3 to pass through the stack structure 120 in the connection region CTA, and be in contact with the isolation layer 115. According to an example embodiment, the first dummy channel structures 150 may pass through the stepped end parts of the stack structure 120 in the connection region CTA. The first dummy channel structure S150 may extend while passing through the gate pad part GEP of each of the gate electrodes 122. The first dummy channel structures 150 each may pass through at least one of the interlayer insulating layers 121 and the gate pad part GEP of the gate electrode 122, and at least one of the gate electrodes 122 under the gate pad part GEP. The first dummy channel structures 150 may pass through the mold insulating layer 126 provided on the gate electrodes 122. The first dummy channel structure 150 most adjacent to the cell array region CAA among the first dummy channel structures 150 may be in direct contact with the isolation layer 115 while passing through the mold insulating layer 126, the end portion of the gate pad part GEP of the gate electrode 122f, which is the uppermost one from among the gate electrodes 122, the other gate electrodes 122 below the gate electrode 122f, and the interlayer insulating layers 121. The first dummy channel structure 150 most distant from the cell array region CAA may be in direct contact with the isolation layer 115 while passing through the mold insulating layer 126, the end portion of the gate pad part GEP of the gate electrode 122b (e.g., the second lowermost one from among the gate electrodes 122) on the substrate 110, the gate electrode 122a (e.g., the lowermost one from among the gate electrodes 122), and the interlayer insulating layers 121. The first dummy channel structures 150 may support end portions of the gate electrodes 122 in the second region (e.g., corresponding to the connection region CTA) to mitigate or prevent the end portions of the gate electrodes 122 from collapsing during a process.

The first dummy channel structures 150 may not be in direct contact with the substrate 110 because the bottoms of the first dummy channel structures 150 are in direct contact with the isolation layer 115, thereby securing insulating characteristics between the first dummy channel structures 150 and the substrate 110. Thus, high reliability of the semiconductor memory device may be secured by mitigating or preventing a leakage current via the first dummy channel structures 150 from occurring.

The first dummy data storing pattern 153 may include a material which is the same as or substantially similar to that of the first cell data storing pattern 133. The first dummy data storing pattern 153 has the same or substantially similar structure as that of the first cell data storing pattern 133. The first dummy data storing pattern 153 may include a first dummy outer insulating film 153a, a first dummy inner insulating film 153b, and a first dummy charge storage film 153c. The first dummy outer insulating film 153a, the first dummy inner insulating film 153b, and the first dummy charge storage film 153c may be the same as or substantially similar to the first cell outer insulating film 133a, the first cell inner insulating film 133b, and the first cell charge storage film 133c, respectively. However, one side of the first dummy outer insulating film 153a may be close to the gate electrodes 122 and another side thereof may be close to the mold insulating layer 126 as illustrated in FIG. 7B.

The first dummy channel pattern 154 may include a material which is the same as or substantially similar to that of the first cell channel pattern 134. The first dummy channel pattern 154 may have the same or substantially similar structure as that of the first cell channel pattern 134 except that a bottom surface of the first dummy channel pattern 154 is separated from the substrate 110 by the isolation layer 115 and is thus electrically insulated from the substrate 110. The first dummy-embedded insulating pattern 155 may include a material which is the same as or substantially similar to that of the first cell-embedded insulating pattern 135. The first dummy-embedded insulating pattern 155 may have the same or substantially similar structure as that of the first cell-embedded insulating pattern 135. The first dummy conductive pattern 156 may include a material which is the same as or substantially similar to that of the first cell conductive pattern 136. The first dummy conductive pattern 156 may have the same structure as that of the first cell conductive pattern 136.

According to an example embodiment, second dummy channel structures 160 may be further provided in the second region. In the second region, at least some first dummy channel structures 150 may be replaced with the second dummy channel structures 160. Some first dummy channel structures 150 may be omitted on the basis of an array of the first dummy channel structures 150, and the second dummy channel structures 160 may be located on locations corresponding to the omitted first dummy channel structures 150. In some example embodiments, in the second region, the first dummy channel structures 150 may not be omitted and second dummy channel structures 160 may be additionally provided. The second dummy channel structures 160 may be interposed between the first dummy channel structures 150. In this case, the first dummy channel structures 150 may be formed in a part of the second region, and the second dummy channel structures 160 may be formed in another part of the second region. The isolation layer 115 may not be provided under the second dummy channel structures 160 located in the second region, and thus the second dummy channel structures 160 may be electrically connected to each other.

The second dummy channel structure 160 may include a second dummy semiconductor pattern 161, a second dummy data storing pattern 163, a second dummy channel pattern 164, and a second dummy-embedded insulating pattern 165. The second dummy channel structure 160 may further include a second dummy pattern oxide film 162 and a second dummy conductive pattern 166. The first dummy channel structures 150 may be located in the fourth region corresponding to both the dummy block DB and the connection region CTA. The second dummy channel structures 160 may be arranged in the same form as the first dummy channel structures 150.

The second dummy channel structure 160 may be in direct contact with the substrate 110 while passing through the stack structure 120 in the connection region CTA. The second dummy channel structure 160 may vertically pass through the gate electrodes 122 and the interlayer insulating layers 121 to be in direct contact with the substrate 110 while extending in the third direction D3. A stack assembly of second dummy channel structures 160 and a coupling relation between the second dummy channel structures 160 and the mold insulating layer 126 may be the same as or substantially similar to the stack assembly of first dummy channel structures 150 and a coupling relation between the first dummy channel structures 150 and the mold insulating layer 126, respectively. In some example embodiments, the second dummy channel structures 160 may be electrically connected to the substrate 110. The second dummy channel structures 160 may be different from the first dummy channel structures 150 in terms of an electrical connection to the substrate 110. The second dummy channel structures 160 provided in the fourth region may support the end portions of the gate electrodes 122, thereby mitigating or preventing the gate electrodes 122 from collapsing.

The second dummy channel structure 160 may extend to the substrate 110 so as to support even the gate electrode 122a, which is the lowermost one from among the gate electrodes 122. During a process of manufacturing a semiconductor memory device, a test may be conducted to determine whether the second dummy channel structure 160 extends up to the substrate 110 after a process of forming a channel structure is performed. Whether the second dummy channel structure 160 extends up to the substrate 110 may be determined by supplying an electric charge to the second dummy channel structure 160 and measuring a charge leakage (e.g., a leakage current). When the electric charge supplied to the second dummy channel structure 160 leaks to the substrate 110, it may be determined that the second dummy channel structure 160 extends down to the substrate 110. It may be determined that the second dummy channel structure 160 does not extend down to the substrate 110 if the measured value of the charge leakage indicates that the electric charge supplied to the second dummy channel structure 160 does not leak to the substrate 110, and stays within the second dummy channel structure 160.

The second dummy channel structure 160 may have a structure which is the same as or substantially similar to that of the first cell channel structure 130. According to an example embodiment, the second dummy semiconductor pattern 161 may be formed to be the same as or substantially similar to the first cell semiconductor pattern 131. The second dummy pattern oxide film 162 may be formed to be the same as or substantially similar to the first dummy pattern oxide film 132. The second dummy data storing pattern 163 may be formed to be the same as or similar to the first cell data storing pattern 133. The second dummy channel pattern 164 may be formed to be the same as or substantially similar to the first cell channel pattern 134. The second dummy-embedded insulating pattern 165 may be formed to be the same as or substantially similar to the first cell-embedded insulating pattern 135. The second dummy conductive pattern 166 may be formed to be the same as or substantially similar to the first cell conductive pattern 136.

According to an example embodiment, first dummy channel structures 150 may be additionally provided in the fourth region. In the fourth region, the first dummy channel structures 150 may replace some of the second dummy channel structures 160. Some of the second dummy channel structures 160 may be omitted on the basis of an array of the second dummy channel structures 160, and the first dummy channel structures 150 may be provided on locations corresponding to the omitted second dummy channel structures 160. In some example embodiments, in the fourth region, second dummy channel structures 160 may not be omitted and first dummy channel structures 150 may be additionally provided. The first dummy channel structure 150 may be interposed between the second dummy channel structures 160. In this case, the second dummy channel structures 160 may be formed in one part of the fourth region and the first dummy channel structures 150 may be formed in another part of the fourth region. The isolation layer 115 may be formed on the substrate 110 below the first dummy channel structures 150 in the fourth region.

The common source line CSL 170 may include a common source plug 171 and a common source spacer 172. The common source line CSL 170 may be located between the cell blocks CB and between the cell block CB and the dummy block DB. The common source line CSL 170 may vertically pass through the stack structure 120 including the interlayer insulating layers 121 and the gate electrodes 122. The common source line CSL 170 may extend to the common source region 111 such that the common source line CSL 170 is electrically connected to the common source region 111. The common source line CSL 170 may be in direct contact with the common source region 111.

The common source plug 171 may extend along the common source region 111 in the first direction D1. The common source plug 171 may extend from the common source region 111 through the stack structure 120. The common source plug 171 may have a wall structure. The common source plug 171 may have a bar shape extending in the first direction D1 when viewed from above in the D2 direction. The common source plug 171 may include a conductive material (e.g., tungsten, copper, titanium, a titanium nitride, tantalum, a tantalum nitride, silicon, or aluminum).

The common source spacer 172 may be formed between the stack structure 120 and the common source plug 171. The common source spacer 172 may cover sidewalls of the stack structure 120. The common source spacer 172 may fill a space between the common source plug 171 and the stack structure 120. The common source spacer 172 may electrically insulate the common source plug 171 from the gate electrodes 122 of the stack structure 120. The common source spacer 172 may include, for example, a silicon oxide, a silicon nitride, a silicon oxynitride, or a low-K dielectric material.

The bit line BL may be formed on the upper insulating layer 128 in the cell array region CAA. The bit line BL may be formed on the upper insulating layer 128 to cover the top of the bit contact 137. The bit line BL may extend from the top surface of the upper insulating layer 128 in the second direction D2. The bit line BL may be electrically connected to the bit contact 137. The bit line BL may be electrically connected to the first cell channel structure 130 via the bit contact 137. The bit line BL may include a conductive metal (e.g., tungsten).

The bit line BL may not be electrically connected to the second cell channel structure 140. The bit line BL may not be electrically connected to the first dummy channel structure 150 and the second dummy channel structure 160.

The first metal line 183 may be formed on the upper insulating layer 128 in the connection region CTA. The first metal line 183 may cover the top of the gate contact 129. The first metal line 183 may include metal (e.g., aluminum or copper). The first metal line 183 may be electrically connected to the gate contact 129. The first metal line 183 may be electrically connected to the gate electrodes 122 via the gate contact 129.

The second metal line 185 may be formed on the upper insulating layer 128 in the peripheral device region. The second metal line 185 may cover the top of the peripheral contacts 197. The second metal line 185 may include metal (e.g., aluminum or copper). The second metal line 185 may be electrically connected to the top ends of the peripheral contacts 197. The second metal line 185 may be electrically connected to the bit line BL or the first metal line 183.

The peripheral circuit element 190 may be arranged in a peripheral region PR. The peripheral circuit element 190 may include a peripheral gate insulating film 191, a peripheral gate electrode 192, and source and drain regions 193. The peripheral circuit element 190 may include the peripheral contacts 197. A plurality of peripheral circuit elements 190 may be formed in the peripheral region PR. The peripheral circuit element 190 may include, for example, a high-voltage or low-voltage transistor.

The peripheral gate insulating film 191 may be provided on the substrate 110 and include an oxide film or a high-K dielectric film. The peripheral gate electrode 192 may be provided on the peripheral gate insulating film 191. The peripheral gate electrode 192 may include, for example, silicon, a metal silicide, a nickel silicide, a cobalt silicide, a titanium silicide, a tantalum silicide (TaSi), or a metal. Peripheral gate spacers 194 may be arranged on sidewalls of the peripheral gate electrode 192. The source and drain regions 193 may be provided in the substrate 110, and may include an N type impurity (e.g., phosphor (P)) or a P type impurity (e.g., boron (B)). A peripheral protective layer 195 may be formed on the substrate 110 to cover the peripheral gate insulating film 191, the peripheral gate electrode 192, and the source and drain regions 193. The peripheral protective layer 195 may include, for example, a silicon oxide film or a silicon nitride film. The peripheral contacts 197 may be formed to pass through the upper insulating layer 128, the mold insulating layer 126, and the peripheral protective layer 195. The top ends of the peripheral contacts 197 may be exposed at the upper insulating layer 128. The peripheral contacts 197 may include a conductive material (e.g., silicon or tungsten). The peripheral contacts 197 may be electrically connected to the source and drain regions 193.

A method of manufacturing a semiconductor memory device according to an example embodiment of inventive concepts will be described below.

FIGS. 13A to 20A, 13B to 20B, and 13C to 20C are vertical cross-sectional views for describing operations of a method of manufacturing a semiconductor memory device according to an example embodiment of inventive concepts. FIGS. 13A to 20A are vertical cross-sectional views taken along line III-III' of FIG. 2. FIGS. 13B to 20B are vertical cross-sectional views taken along line VI-VI' of FIG. 2. FIGS. 13C to 20C are vertical cross-sectional views taken along line VI-VI' of FIG. 2. A vertical cross-section view of a resultant structure obtained according to the method of manufacturing a semiconductor memory device is the same as or substantially similar to FIGS. 3, 4, and 6. Thus, the resultant structure is not additionally illustrated in the drawings and will be described with reference to FIGS. 3, 4, and 6 below.

Figure 13A:
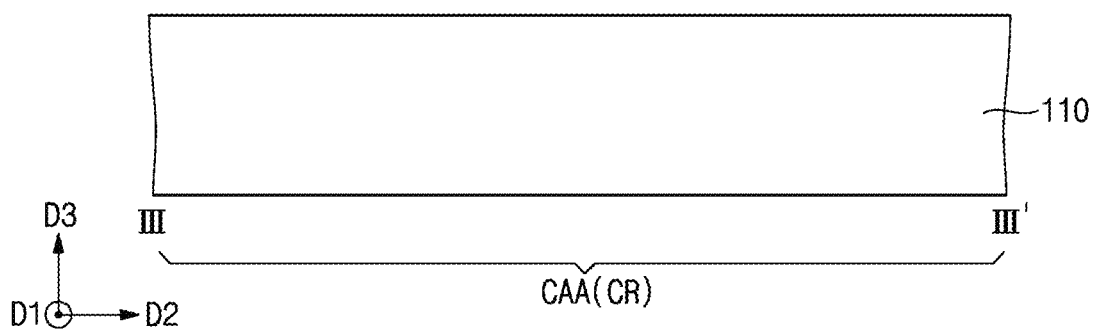
Figure 13B:
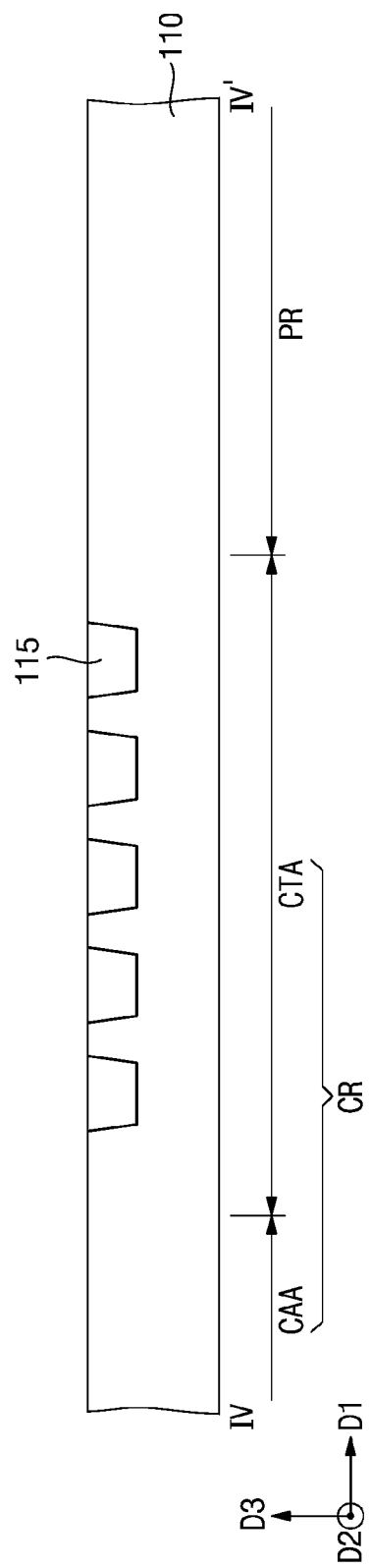
Figure 13C:
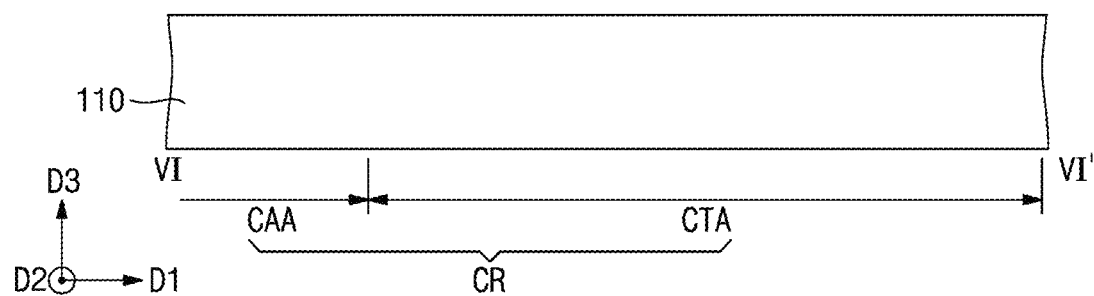

Referring to FIGS. 13A, 13B, and 13C, a plurality of isolation layers 115 may be formed in a connection region CTA of a cell block CB of a substrate 110. First, isolation grooves may be formed at locations of the connection region CTA of the cell block CB on which first dummy channel structures 150 are to be formed. The isolation grooves may be formed downward in the top surface of the substrate 110 by an etching process. The isolation layers 115 may be formed by filling the isolation grooves with an insulating material (e.g., a silicon oxide or a silicon nitride). The isolation layers 115 may be independently formed so that the first dummy channel structures 150 are located thereon. The isolation layers 115 may not be formed in the cell array region CAA of the cell block CB and/or in a cell array region CAA of a dummy block DB.

According to an example embodiment, referring to FIGS. 8 and 9, the isolation grooves may be formed in a trench shape extending in the first direction D1. In some example embodiments, the isolation layers 215 may be formed in a bar shape extending in the first direction D1. In some example embodiments, the isolation layers 215 may be integrally formed below a plurality of first dummy channel structures 150 spaced apart from one another in the first direction D1.

According to an example embodiment, referring to FIG. 10, the isolation grooves may be plate type grooves extending in the first direction D1 and the second direction D2. An isolation layer 315 may be formed in a plate shape extending in the first direction D1 and the second direction D2. The isolation layer 315 may be integrally formed below a plurality of first dummy channel structures 150 spaced apart from one another in the first direction D1 and the second direction D2.

According to an example embodiment, referring to FIG. 12, at least one groove may be formed in the cell array region CAA of the dummy block DB of the substrate 110. The isolation groove may be formed at a location at which a second cell channel structure 140 is formed. The at least one isolation groove may be formed downward in the top surface of the substrate 110 by an etching process. The isolation layers 515 may be formed by filling the at least one isolation groove with an insulating material (e.g., a silicon oxide or a silicon nitride). The isolation layers 515 may be independently formed so that the second cell channel structures 140 may be located thereon.

Figure 14A:
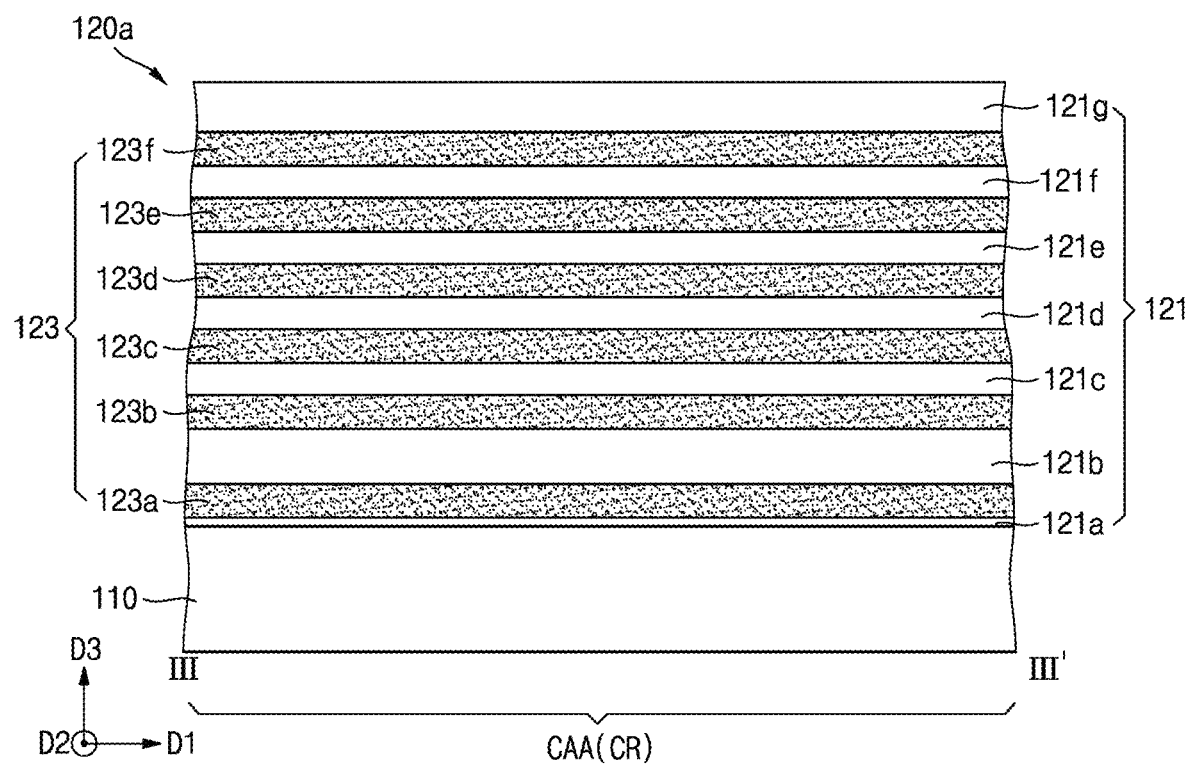
Figure 14B:
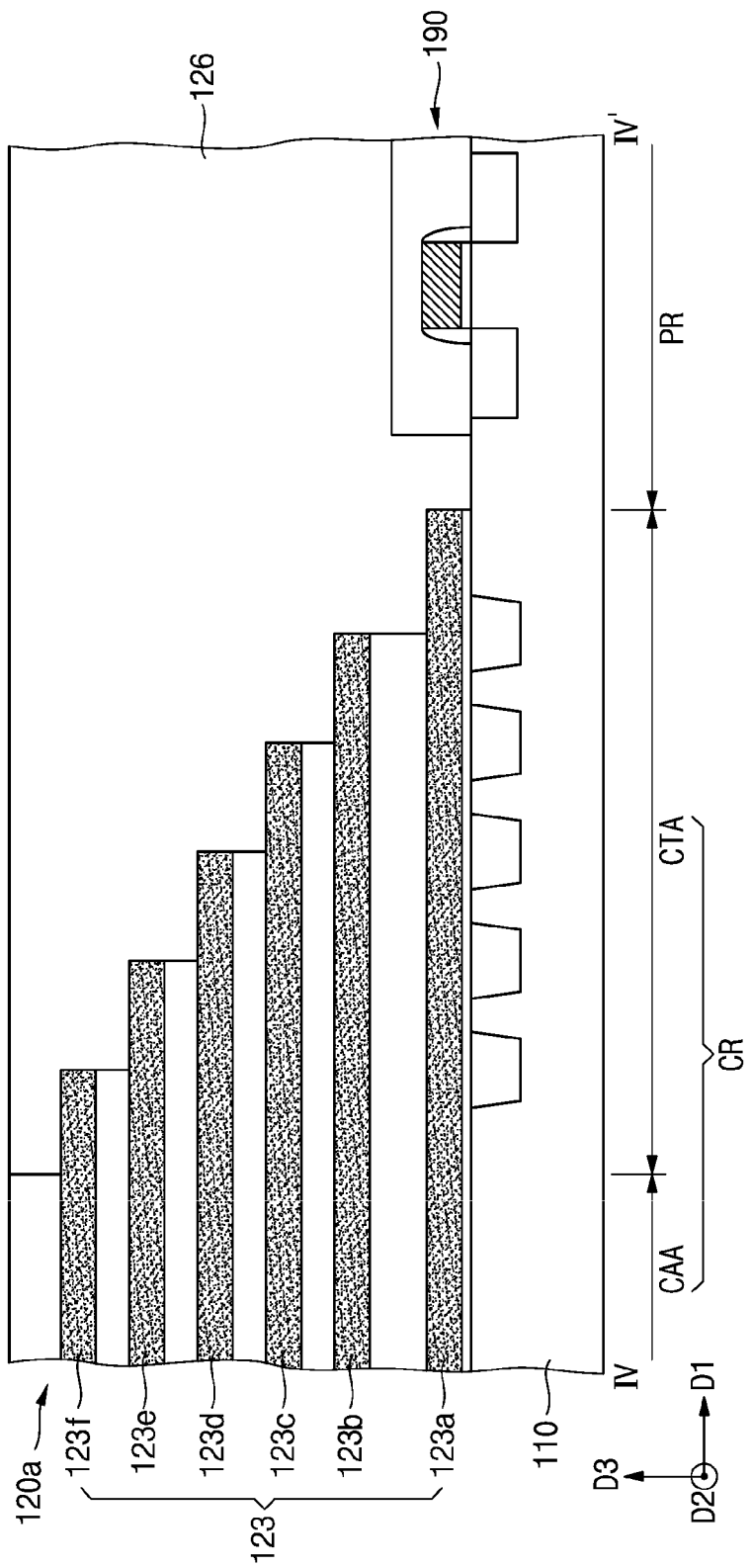
Figure 14C:
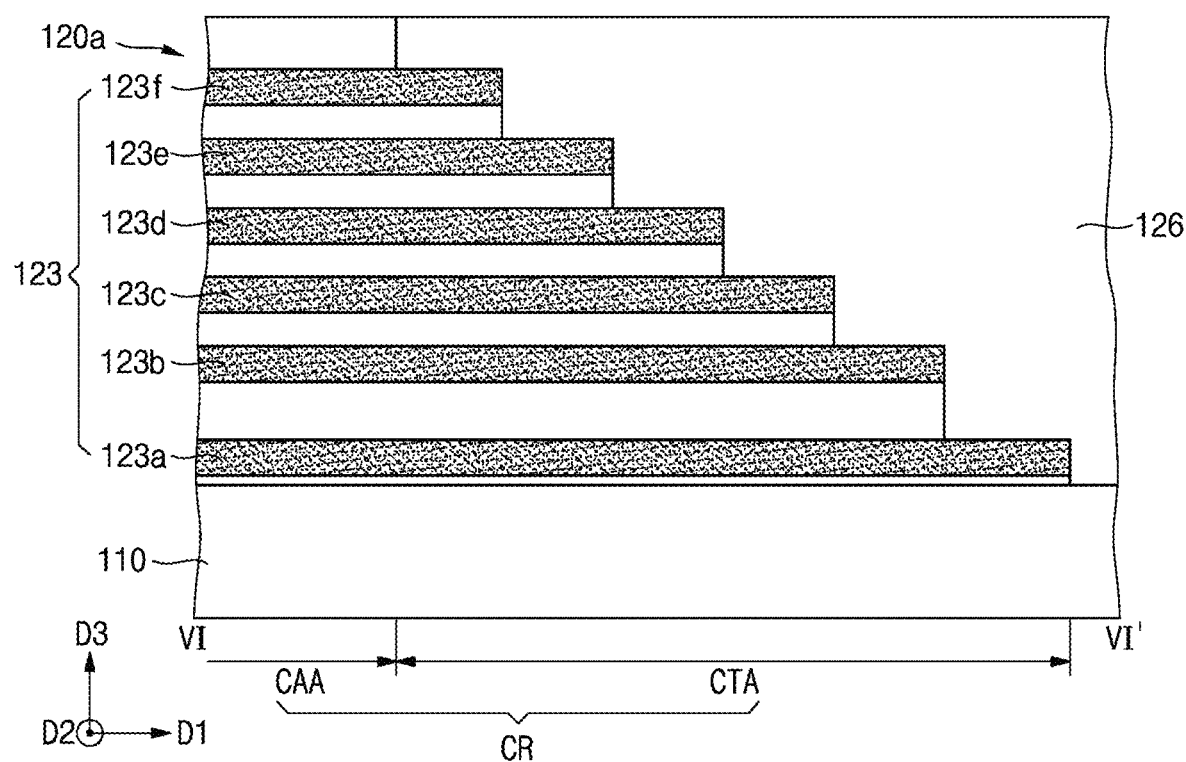

Referring to FIGS. 14A, 14B, and 14C, a peripheral circuit element 190 and a stack mold structure 120*a* may be formed on the substrate 110. At least one peripheral circuit element 190 may be formed in a peripheral region of the substrate 110. The peripheral circuit element 190 may include a peripheral gate insulating film 191, a peripheral gate electrode 192, source and drain regions 193, a peripheral gate spacer 194, and a peripheral protective layer 195. For example, the peripheral circuit element 190 may be formed according to a process which will be described below. The peripheral gate insulating film 191 and the peripheral gate electrode 192 may be sequentially stacked on the substrate 110. The peripheral gate insulating film 191 and the peripheral gate electrode 192 may be formed by a patterning process. The peripheral gate electrode 192 may be formed of, for example, an impurity-doped polysilicon or a metal material. The peripheral gate insulating film 191 may include, for example, a silicon oxide film or a high-K dielectric film. The source and drain regions 193 and the peripheral gate spacer 194 may be formed at opposite sides of the peripheral gate electrode 192. The peripheral protective layer 195 may be formed to cover the peripheral gate electrode 192, the source and drain regions 193, and the peripheral gate spacer 194. The peripheral protective layer 195 may be formed by depositing an insulating material on the substrate 110 and planarizing the insulating material. The peripheral protective layer 195 may be patterned and be thus formed only on the substrate 10 in a peripheral circuit region PR. The peripheral protective layer 195 may expose the cell array region CAA and the connection region CTA on the substrate 110.

The stack mold structure 120*a* may be formed in the cell array region CAA, the connection region CTA, and the peripheral circuit region PR. The stack mold structure 120*a* may cover the top and sidewalls of the peripheral protective layer 195. The stack mold structure 120*a* may include a plurality of interlayer insulating layers 121 (121*a*, 121*b*, 121*c*, 121*d*, 121*e*, 121*f*, and 121*g*) and a plurality of sacrificial layers 123 (123*a*, 123*b*, 123*c*, 123*d*, 123*e*, and 123*f*). The interlayer insulating layers 121 and the sacrificial layers 123 may be alternately and repeatedly stacked.

The interlayer insulating layer 121*a*, which is a lowermost one from among the interlayer insulating layers 121 that is in contact with the substrate 110, may be formed to be thinner than the other interlayer insulating layers 121*b*, 121*c*, 121*d*, 121*e*, 121*f*, and 121*g*. The interlayer insulating layer 121*b*, which is the second lowest one from among the interlayer insulating layers 121, and the interlayer insulating layer 121*g*, which is the uppermost one from among the interlayer insulating layers 121 may be formed to be thicker than the other interlayer insulating layers 121*c*, 121*d*, 121*e*, and 121*f*. For example, the sacrificial layers 123 may have the same thickness.

The interlayer insulating layers 121 and the sacrificial layers 123 may include materials having etching selectivity in a wet etching process. For example, the sacrificial layers 123 may have higher etching rate than the interlayer insulating layers 121 in the wet etching process. The interlayer insulating layers 121 may include, for example, a silicon oxide or a silicon nitride. The interlayer insulating layers 121 and the sacrificial layers 123 may be formed by a deposition process. For example, the interlayer insulating layers 121 and the sacrificial layers 123 may be formed by, for example, thermal chemical vapor deposition (CVD), plasma enhanced CVD (PECVD), or atomic layer deposition (ALD).

Next, the stack mold structure 120*a* may be patterned such that a connection region CTA of the stack mold structure 120*a* has a stepped structure, and be covered with the mold insulating layer 126. In the stack mold structure 120*a*, end portions of the sacrificial layers 123 may have a stepped structure. The areas of the sacrificial layers 123 and the interlayer insulating layers 121 may decrease from the bottom of the substrate 110 to the top thereof. Pad parts may become closer to the cell array region CAA from the bottom of the substrate 110 to the top thereof.

The mold insulating layer 126 may cover end portions of the stack mold structure 120*a*. For example, the mold insulating layer 126 may cover the pad parts of the sacrificial layers 123. The mold insulating layer 126 may cover the substrate 110 between the connection region CTA and the peripheral circuit region PR and between the stack mold structure 120*a* and the peripheral protective layer 195.

Figure 15A:
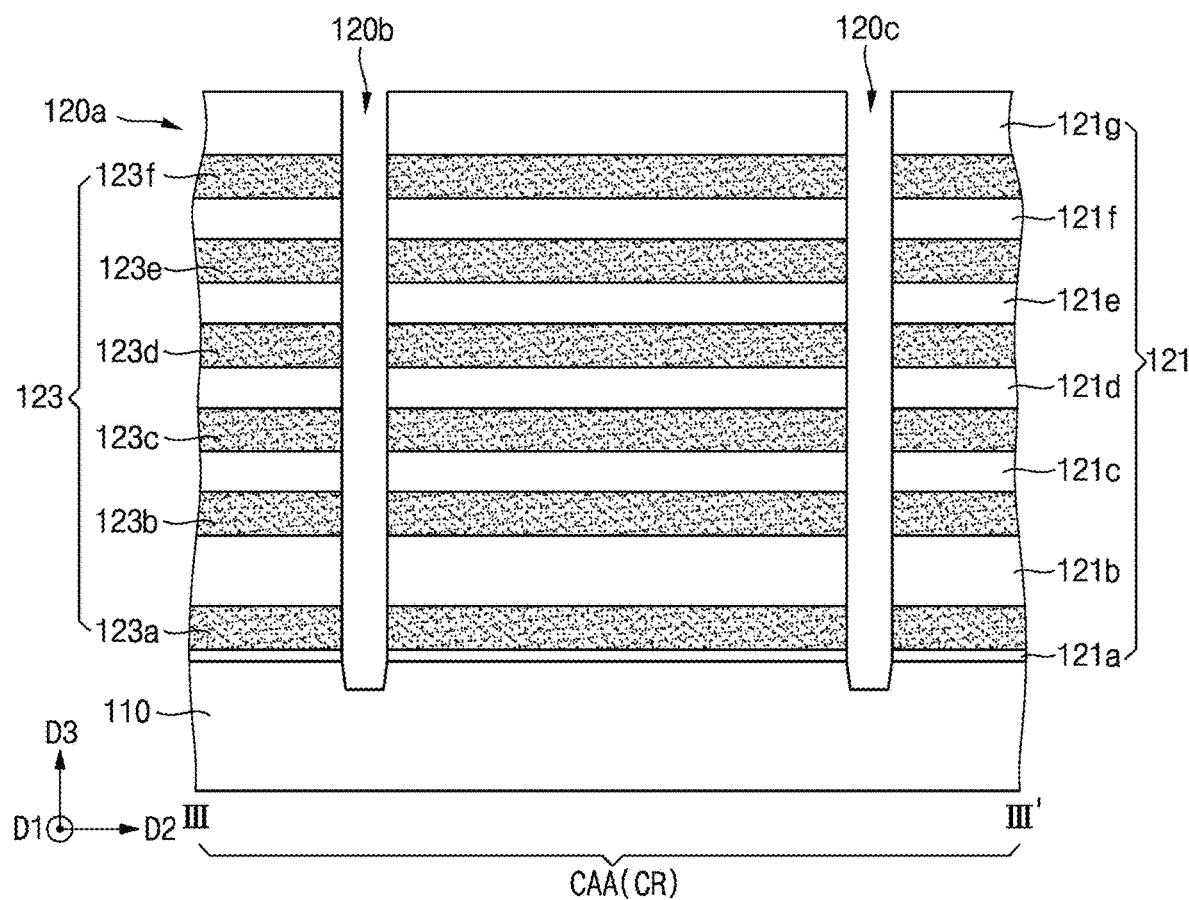
Figure 15B:
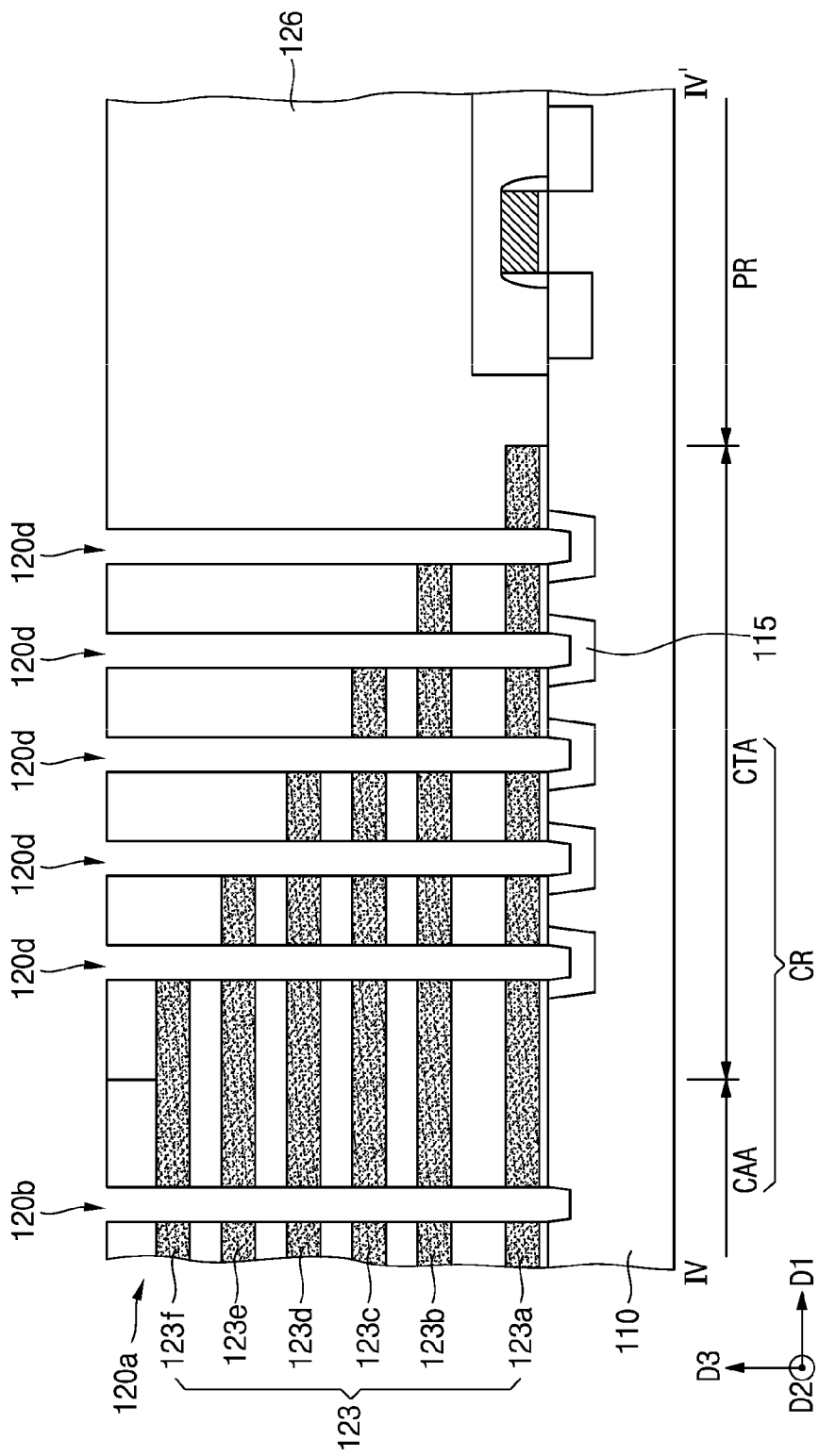
Figure 15C:
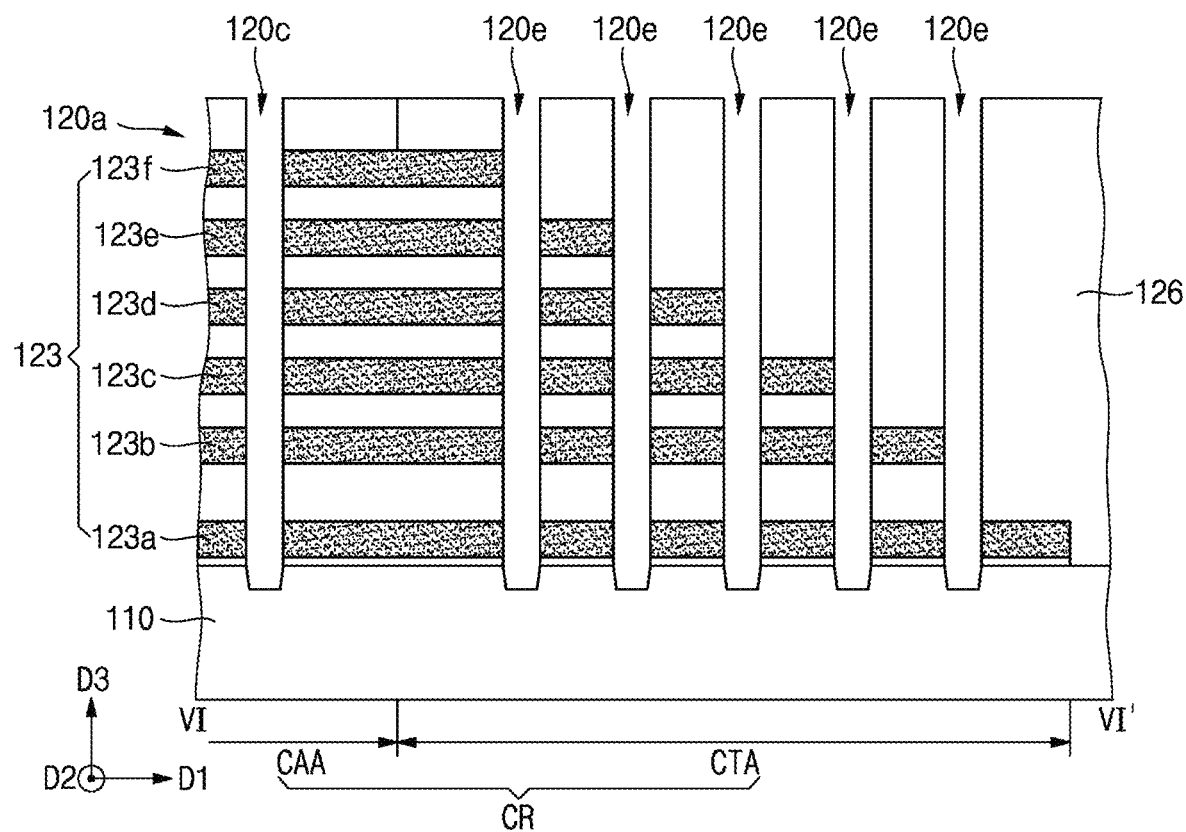

Referring to FIGS. 15A, 15B, and 15C, a first cell channel hole 120*b*, a second cell channel hole 120*c*, a first dummy channel hole 120*d*, and a second dummy channel hole 120*e* may be formed in the cell array region CAA and the connection region CTA.

The first cell channel hole 120*b* may be formed in the cell array region CAA of the cell block CB to pass through the stack mold structure 120*a* in the third direction D3. The first cell channel hole 120*b* may expose the substrate 110. The first cell channel hole 120*b* may be formed by anisotropically etching the stack mold structure 120*a*. During the anisotropic etching to form the first cell channel hole 120*b*, the substrate 110 may also be etched and thus a groove may be formed in the top surface of the substrate 110. The first cell channel hole 120*b* may be located to correspond to a first cell channel structure 130.

The second cell channel hole 120*c* may be formed in the cell array region CAA of the dummy block DB to pass through the stack mold structure 120*a* in the third direction D3. The second cell channel hole 120*c* may expose the substrate 110. The second cell channel hole 120*c* may have a structure that is the same as or substantially similar to the first cell channel hole 120*b*. The second cell channel hole 120*c* may be located to correspond to the second cell channel structure 140.

The first dummy channel hole 120*d* may be formed in the connection region CTA of the cell block CB to pass through end portions of the mold insulating layer 126 and the stack mold structure 120*a* in the third direction D3. The first dummy channel hole 120*d* may be formed to pass through the mold insulating layer, the interlayer insulating layers 121 on end and bottom portions of pad parts of the sacrificial layers 123, and the sacrificial layer 123. The first dummy channel hole 120*d* may expose the isolation layer 115. While etching is performed to form the first dummy channel hole 120*d*, the isolation layer 115 may be also etched and thus a groove may be formed in a top surface of the isolation layer 115. The first dummy channel hole 120*d* may be located to correspond to the first dummy channel structure 150.

The second dummy channel hole 120*e* may be formed in the connection region CTA of the dummy block DB to pass through end portions of the mold insulating layer 126 and the stack mold structure 120*a*. The second dummy channel hole 120*e* may have a structure that is the same as or substantially similar to the first dummy channel hole 120*d*. However, the second dummy channel hole 120*e* may expose the substrate 110. The second dummy channel hole 120*e* may be arranged as the second dummy channel structure 160 illustrated in FIG. 2.

Figure 16B:
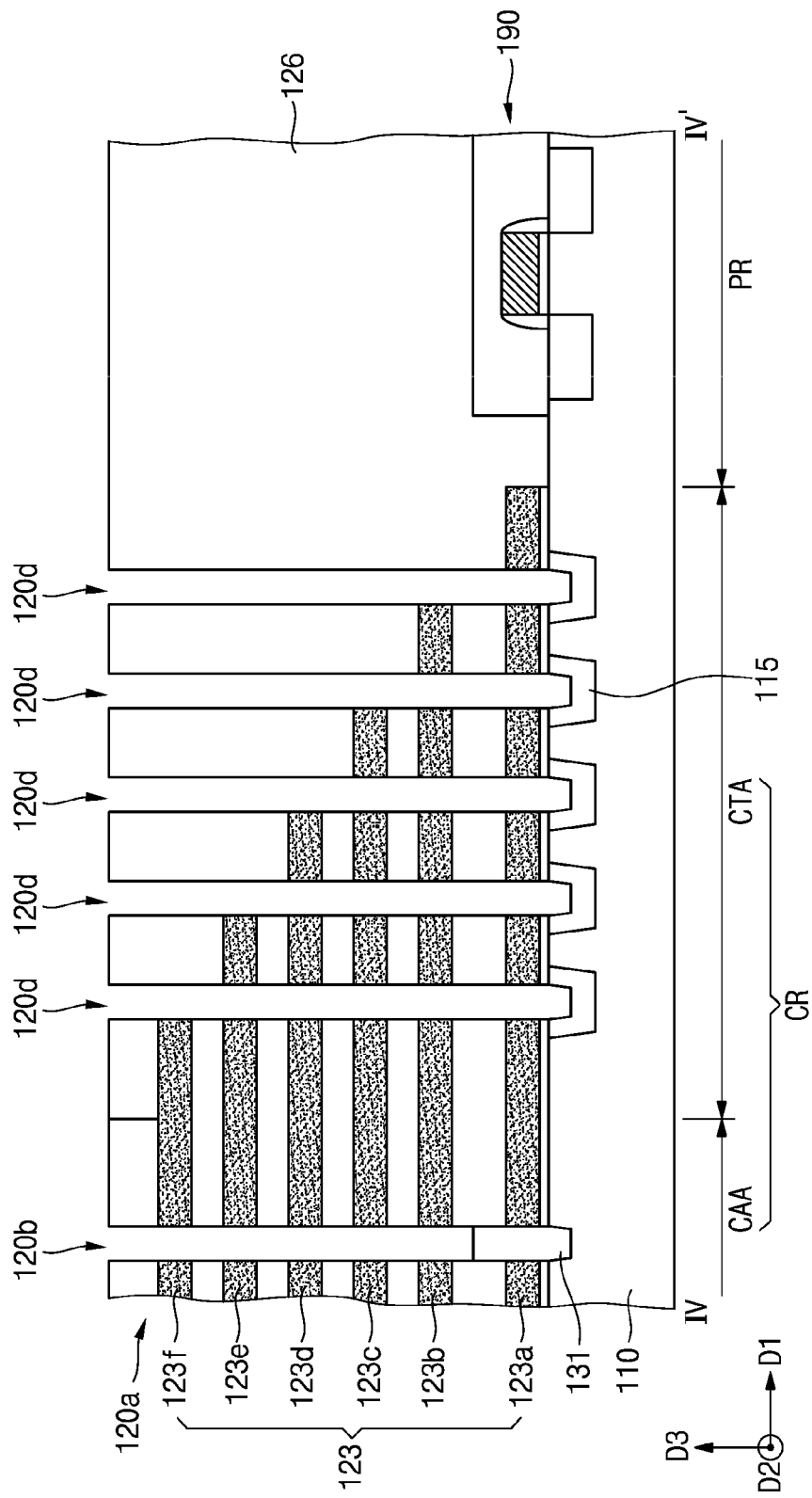
Figure 16C:
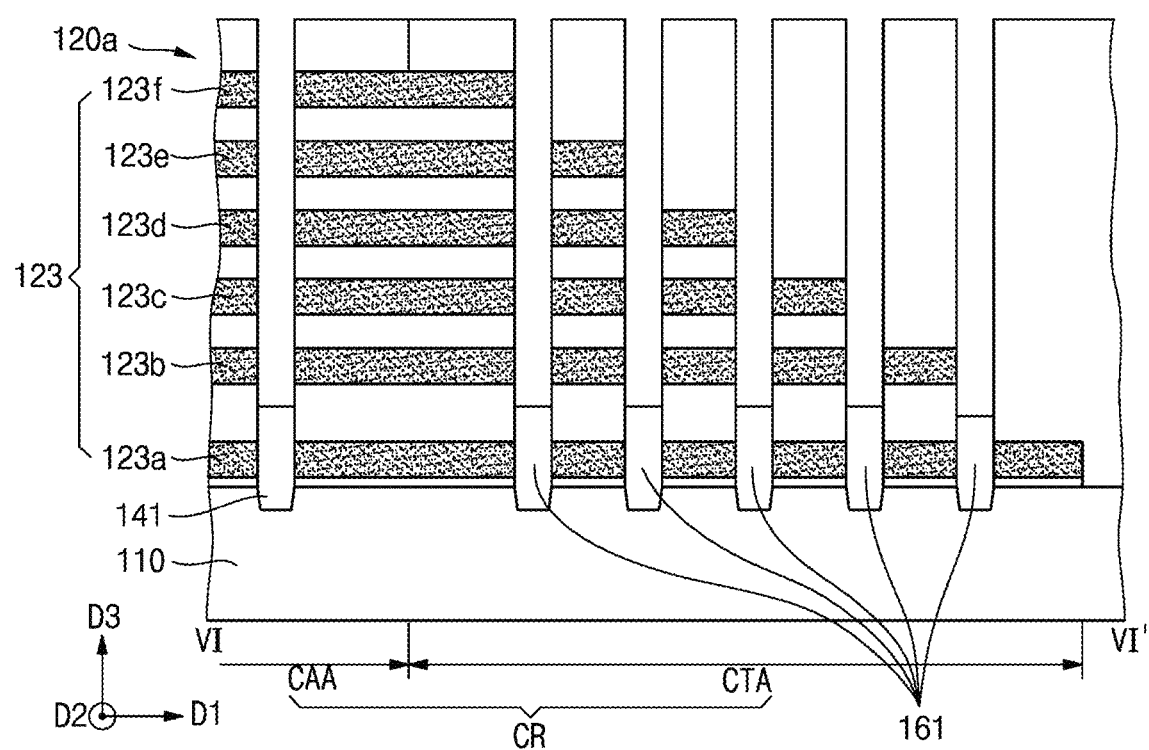

Referring to FIGS. 16A, 16B, and 16C, semiconductor patterns of the first cell channel structure 130, the first dummy channel structure 150, and the second dummy channel structure 160 may be formed in the first cell channel hole 120*b*, the first dummy channel hole 120*d*, and the second dummy channel hole 120*e*, respectively. A first cell semiconductor pattern 131, a second cell semiconductor pattern 141, and a second dummy semiconductor pattern 161 may be formed in the first cell channel hole 120*b*, the first dummy channel hole 120*d*, and the second dummy channel hole 120*e*, respectively. Lower portions of the first cell channel hole 120*b*, the second cell channel hole 120*c*, and the second dummy channel hole 120*e* may be filled with the first cell semiconductor pattern 131, the second cell semiconductor pattern 141, and the second dummy semiconductor pattern 161, respectively. Top surfaces of the first cell semiconductor pattern 131 and the second cell semiconductor pattern 141 may be at higher levels than the sacrificial layer 123*a*, which is the lowermost one from among the sacrificial layers 123, and may be at lower levels than a bottom surface of the interlayer insulating layer 121*b*, which is the second lowest one from among the interlayer insulating layers 121. The first cell semiconductor pattern 131 and the second cell semiconductor pattern 141 may be formed to have the same height. A second dummy semiconductor pattern 161 farther from cell array region CAA may be formed to have a lower height. In some example embodiments, one from among the second dummy semiconductor patterns 161 that is farthest from the cell array region CAA may have a first height height, and the remaining second dummy semiconductor patterns 161 may have a second height, which is higher that the first height. The first cell semiconductor pattern 131, the second cell semiconductor pattern 141, and the second dummy semiconductor pattern 161 may be in direct contact with the substrate 110. Portions of the first cell semiconductor pattern 131, the second cell semiconductor pattern 141, and the second dummy semiconductor pattern 161 may be embedded into the substrate 110 and the remaining portions thereof may protrude from the top of the substrate 110.

The first cell semiconductor pattern 131, the second cell semiconductor pattern 141, and the second dummy semiconductor pattern 161 may be formed by an epitaxial growth process using the top surfaces of the substrate 110 exposed via the first cell channel hole 120*b*, the first dummy channel hole 120*d*, and the second dummy channel hole 120*e* as seed layers. The first cell semiconductor pattern 131, the second cell semiconductor pattern 141, and the second dummy semiconductor pattern 161 may be epitaxial patterns including silicon. The first cell semiconductor pattern 131, the second cell semiconductor pattern 141, and the second dummy semiconductor pattern 161 may include single crystal silicon or single crystal silicon-germanium. The first cell semiconductor pattern 131, the second cell semiconductor pattern 141, and the second dummy semiconductor pattern 161 may not be doped with an impurity or may be doped with impurity ions having the same conductivity type as that of the substrate 110. Because the isolation layer 115 is exposed via the first dummy channel hole 120d, a semiconductor pattern may not be grown in the first dummy channel hole 120d. The isolation layer 115 may include an insulating film (e.g., a silicon oxide film), and thus may not be used as a seed layer in a selective epitaxial growth process.

According to an example embodiment illustrated in FIG. 11, when the isolation layers 415 located in the connection region CTA of the cell block CB are P+ semiconductor patterns, a second semiconductor pattern may be formed in the first dummy channel hole 120d. Because the isolation layers 115 serve as seed layers, while forming the first cell semiconductor pattern 131 in the first cell channel hole 120b, the second semiconductor pattern may also be formed in the first dummy channel hole 120d.

According to an example embodiment illustrated in FIG. 12, the second cell semiconductor pattern 141 may not be formed in the second cell channel hole 120c located in the cell array region CAA of the dummy block DB. When the isolation layer 515 is formed in the second cell channel hole 120c, there exists no seed layer for epitaxial growth, and thus the second cell semiconductor pattern 141 may not be formed.

Referring to FIGS. 17A, 17B, 17C, 21A, and 21B, the remaining structures of the first cell channel structure 130, the second cell channel structure 140, the first dummy channel structure 150, and the second dummy channel structure 160 may be formed in the first cell channel hole 120b, the second cell channel hole 120c, the first dummy channel hole 120d, and the second dummy channel hole 120e, respectively. The first cell channel structure 130 may further include a first cell data storing pattern 133, a first cell channel pattern 134, a first cell-embedded insulating pattern 135, and a first cell conductive pattern 136, which are formed on the first cell semiconductor pattern 131.

The first cell data storing pattern 133 may be coated to cover inner walls of the first cell channel hole 120b. An outer circumferential surface of the first cell data storing pattern 133 may be in contact with the interlayer insulating layers 121 and the sacrificial layers 123 of the stack mold structure 120a. The first cell data storing pattern 133 may include a first cell outer insulating film 133a, a first cell inner insulating film 133b, and a first cell charge storage film 133c. The first cell outer insulating film 133a, the first cell charge storage film 133c, and the first cell inner insulating film 133b may be sequentially formed in an inward direction, starting from an inner wall of the first cell channel hole 120b. The first cell inner insulating film 133b may be a silicon oxide film. The first cell outer insulating film 133a and the first cell charge storage film 133c may be formed by PECVD or ALD. The first cell inner insulating film 133b may be formed by PECVD, ALD, or thermal oxidation. The first cell inner insulating film 133b may be in contact with the first cell channel pattern 134.

The first cell channel pattern 134 may be formed to be in contact with the first cell data storing pattern 133. The first cell channel pattern 134 may be formed by CVD, ALD, or an epitaxial process.

The first cell-embedded insulating pattern 135 may be formed to fill an inner space of the first cell channel pattern 134.

The first cell conductive pattern 136 may be formed on the first cell channel pattern 134 and the first cell-embedded insulating pattern 135 in the first cell channel hole 120b. The first cell conductive pattern 136 may be in contact with the first cell channel pattern 134. The first cell conductive pattern 136 may include a conductive material.

The second cell channel structure 140 and the second dummy channel structure 160 may be formed by the same or substantially similar process as that of the first cell channel structure 130. The first dummy channel structure 150 may be formed by the same or substantially similar process as that of the first cell channel structure 130 except that the first dummy channel structure 150 is formed on the isolation layer 115.

Next, a trench 127 may be formed in the stack mold structure 120a in a cell region CR. In the cell region CR, the trench 127 may be formed between cell blocks CB and between a cell block CB and a dummy block DB. The trench 127 may be formed to extend in the first direction D1 from the cell array region CAA to the connection region CTA. The trench 127 may be formed by patterning the stack mold structure 120a. The trench 127 may be formed by anisotropically etching the stack mold structure 120a. The trench 127 may pass through the stack mold structure 120a to expose the substrate 110. The trench 127 may expose sidewalls of the interlayer insulating layers 121 and the sacrificial layers 123 of the stack mold structure 120a. A common source region 111 may be formed in the substrate 110 exposed via the trench 127. The stack mold structure 120a having the trench 127 may be used as a mask during an ion implantation process of forming the common source region 111.

Figure 18A:
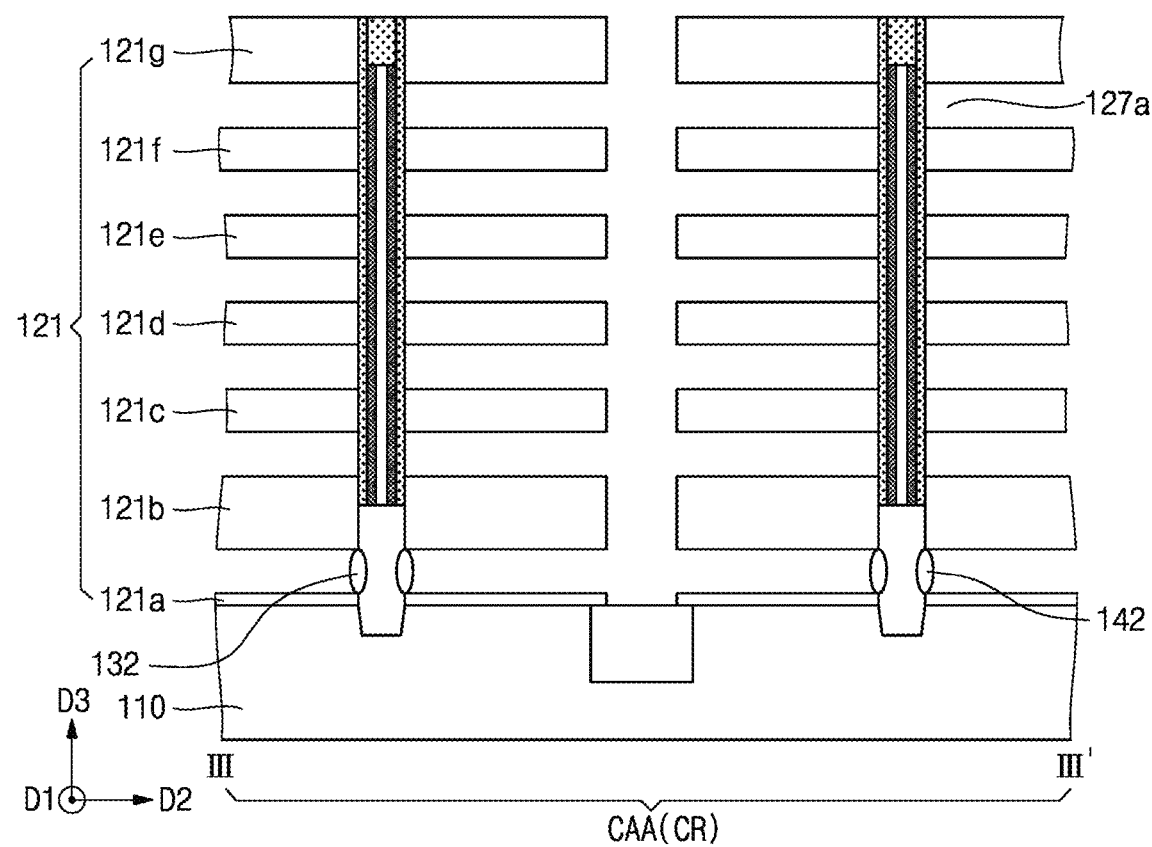
Figure 18B:
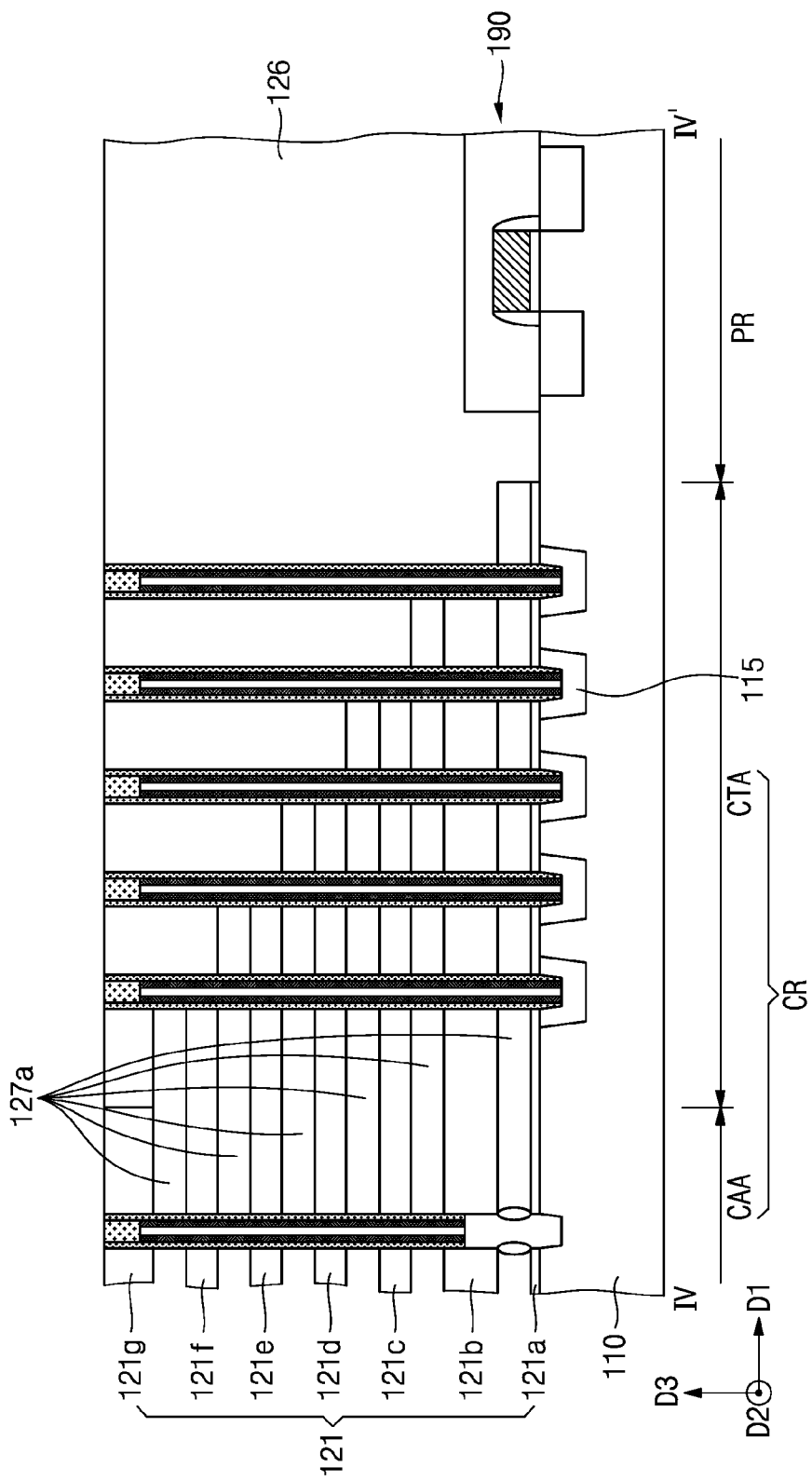
Figure 18C:
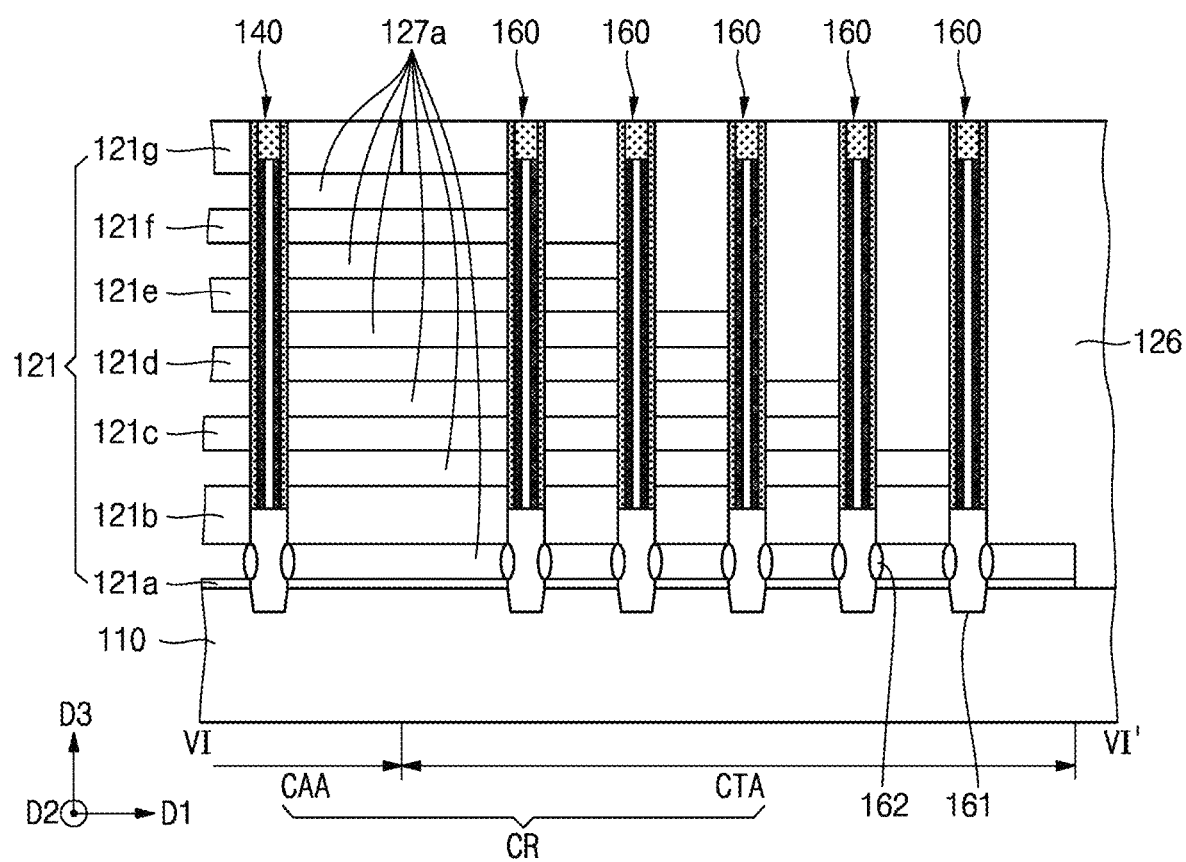

Referring to FIGS. 18A, 18B, and 18C, trench openings 127a may be formed in the stack mold structure 120a in the cell array region CAA and the connection region CTA. The trench openings 127a may be formed by removing the sacrificial layers 123 of the stack mold structure 120a exposed via the trench 127. The trench openings 127a may be formed by removing the sacrificial layers 123 by isotropic etching. The isotropic etching may be performed using an etchant having etching selectivity between the interlayer insulating layers 121 and the mold insulating layer 126. For example, when the sacrificial layers 123 are silicon nitride films and the interlayer insulating layers 121 and the mold insulating layer 126 are silicon oxide films, the isotropic etching may be performed using an etchant containing phosphoric acid. The trench openings 127a may be formed to expose some portions of sidewalls of the first cell channel structure 130, the second cell channel structure 140, first dummy channel structure 150, and the second dummy channel structure 160.

A first cell pattern oxide film 132, a second cell pattern oxide film 142, and a second dummy pattern oxide film 162 may be formed on sidewalls of the first cell semiconductor pattern 131, the second cell semiconductor pattern 141, and the second dummy semiconductor pattern 161, respectively. The first cell pattern oxide film 132, the second cell pattern oxide film 142, and the second dummy pattern oxide film 162 may be formed by thermally oxidizing the sidewalls of the first cell semiconductor pattern 131, the second cell semiconductor pattern 141, and the second dummy semiconductor pattern 161, which are exposed via the trench openings 127a, respectively. The first cell pattern oxide film 132, the second cell pattern oxide film 142, and the second dummy pattern oxide film 162 may each have a convex shape and may be uniformly formed. Because the first cell pattern oxide film 132, the second cell pattern oxide film 142, and the second dummy pattern oxide film 162 are formed on the sidewalls of the first cell semiconductor pattern 131, the second cell semiconductor pattern 141, and the second dummy semiconductor pattern 161, respectively, by thermal oxidation, the sidewalls of the first cell semiconductor pattern 131, the second cell semiconductor pattern 141, and the second dummy semiconductor pattern 161 each may have a concave cross section.

Figure 19A:
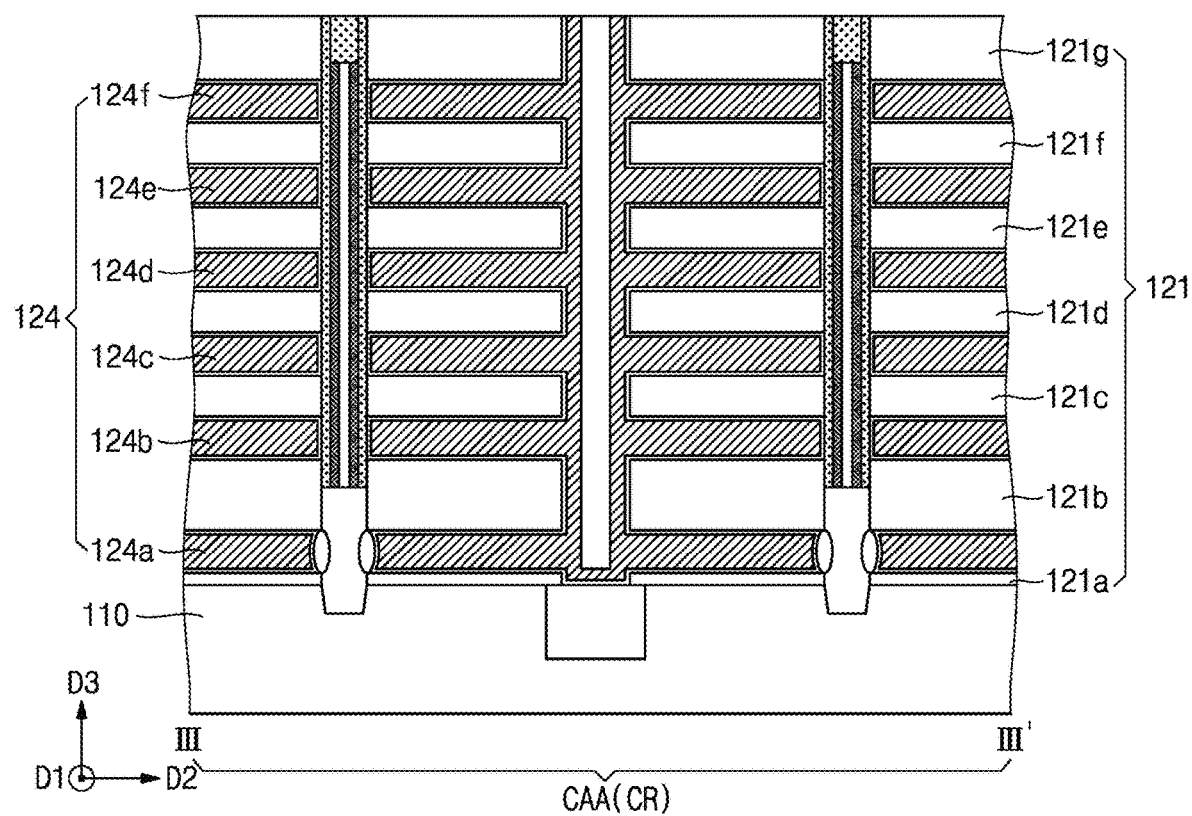
Figure 19B:
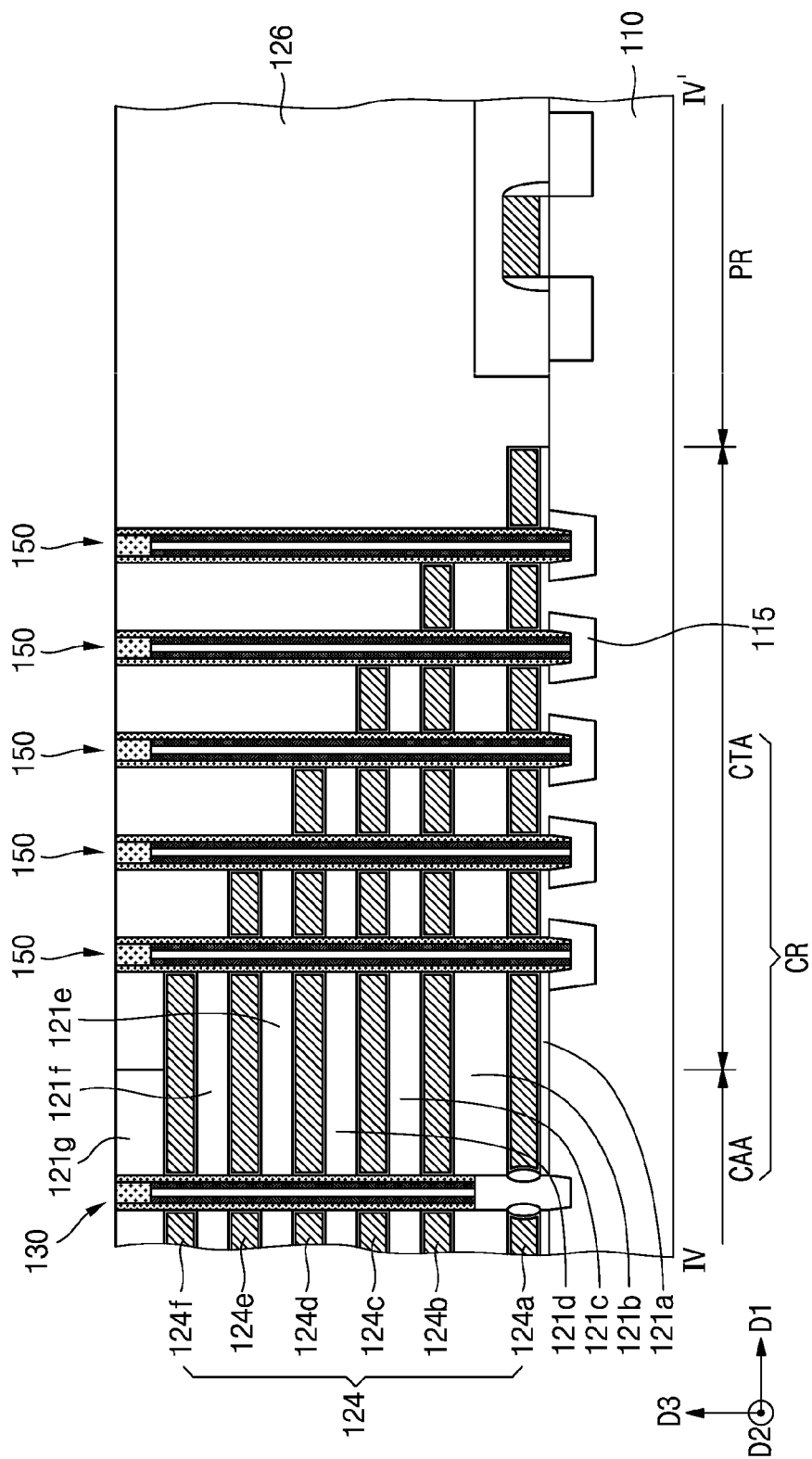
Figure 19C:
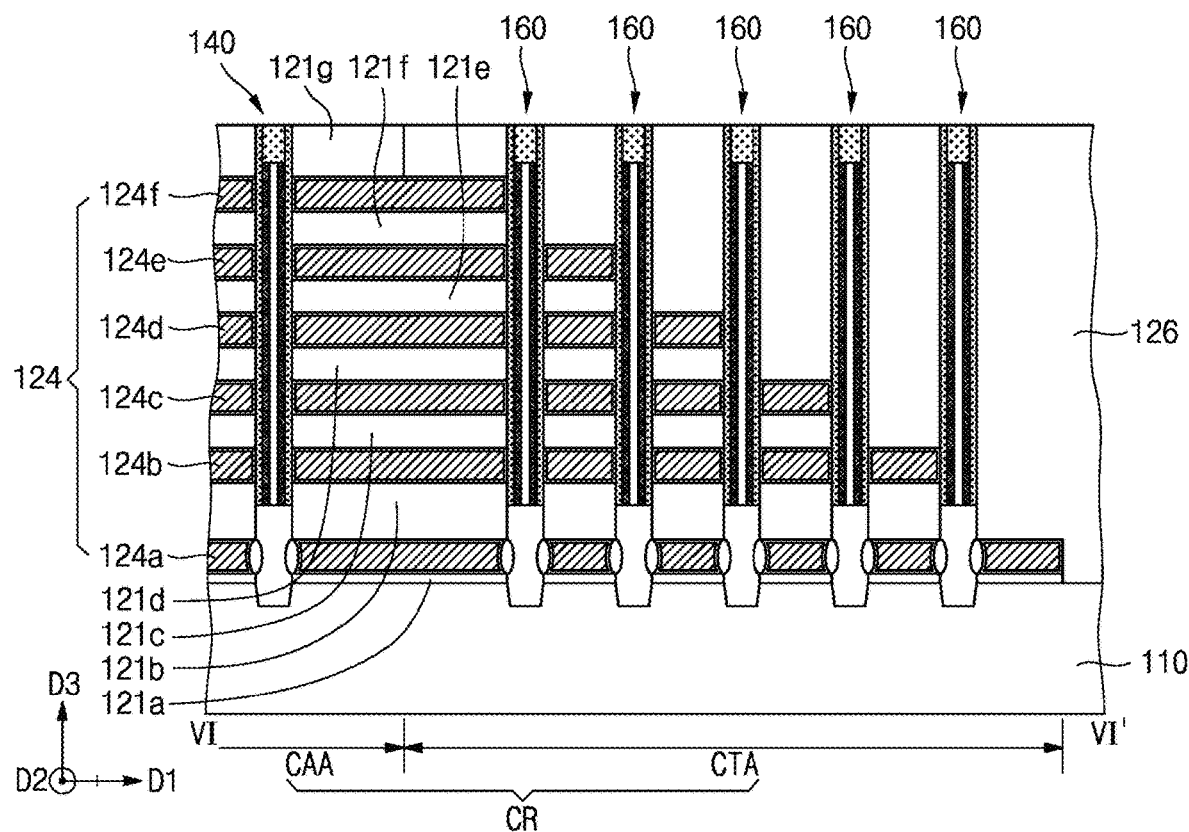

Referring to FIGS. 19A, 19B, and 19C, gate conductive films 124 (124a, 124b, 124c, 124d, 124e, 124f) may be formed to fill the trench 127 and the trench openings 127a. The gate conductive films 124 may be formed while filling the trench openings 127a formed at the locations from which the sacrificial layers 123 are removed. The gate conductive films 124 may be formed by a process having high step coverage, such as CVD or ALD.

Before the gate conductive films 124 are formed, a gate blocking insulation film 125 may be formed inside each of the trench openings 127a. Thus, the gate blocking insulation film 125 may be in contact with the first cell outer insulating film 133a and the first dummy outer insulating film 153a while covering the top, bottom, and side surfaces of the interlayer insulating layers 121. The gate blocking insulation film 125 may include a high-K dielectric film. According to an example embodiment, the gate blocking insulation film 125 may not be formed.

Figure 20A:
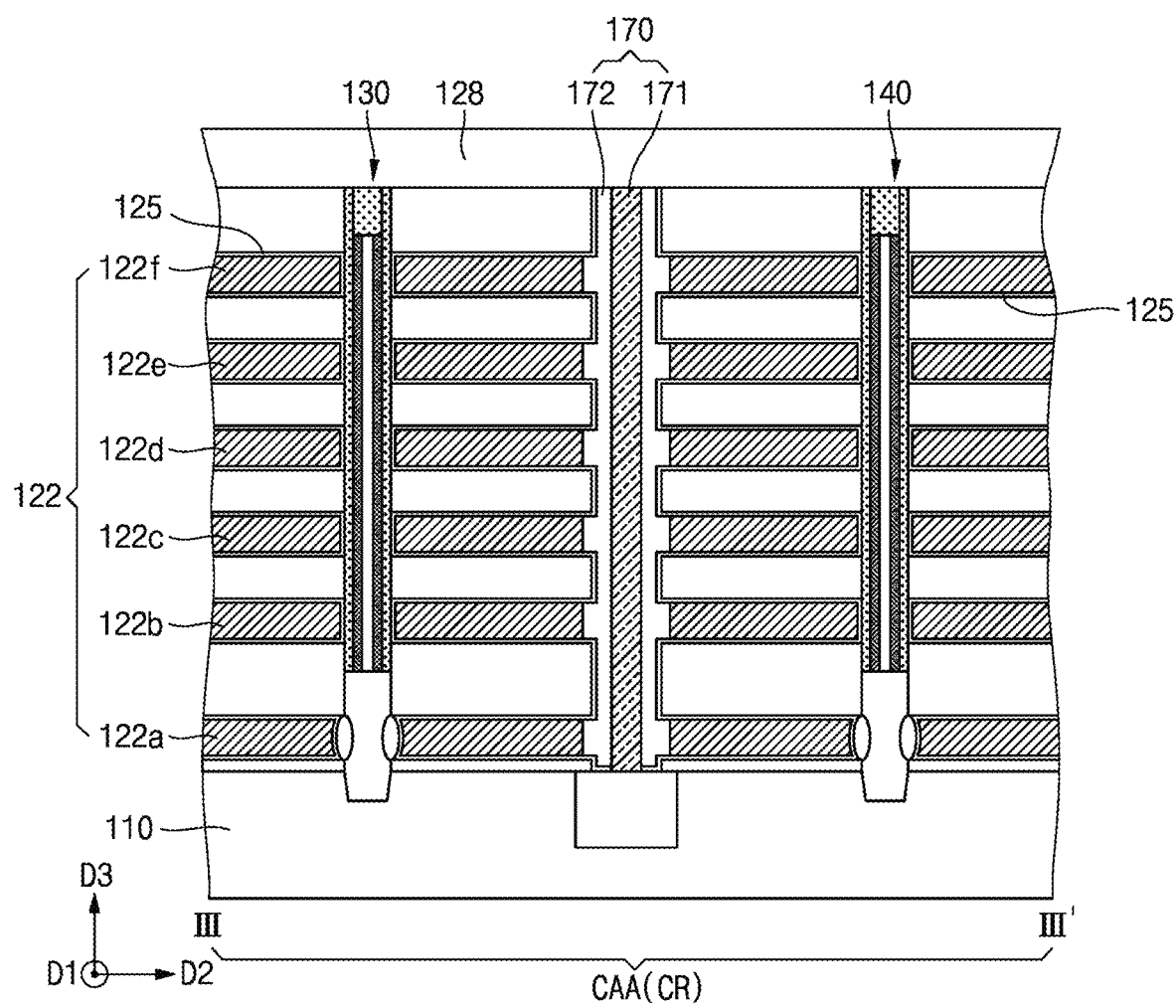
Figure 20B:
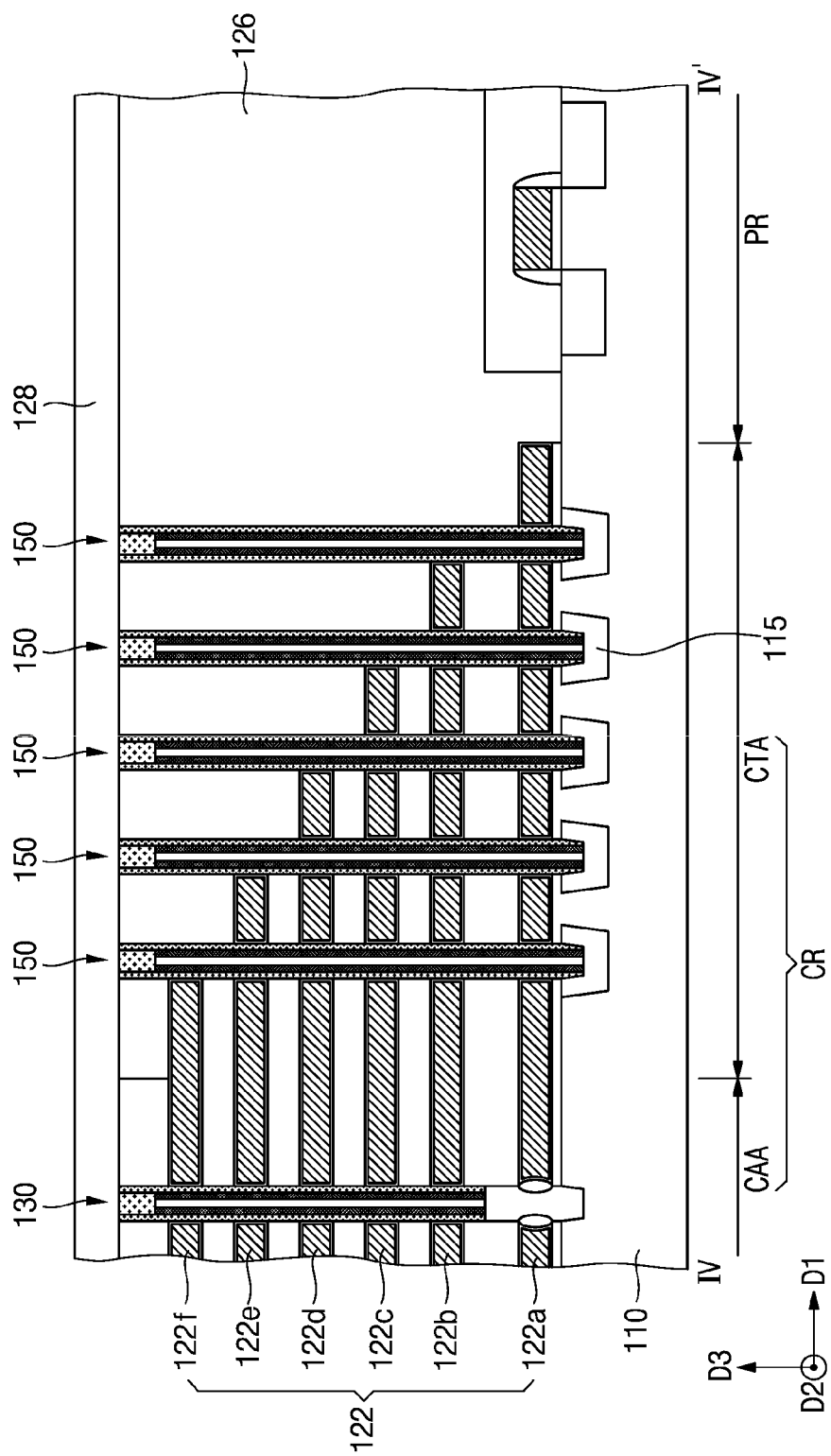
Figure 20C:
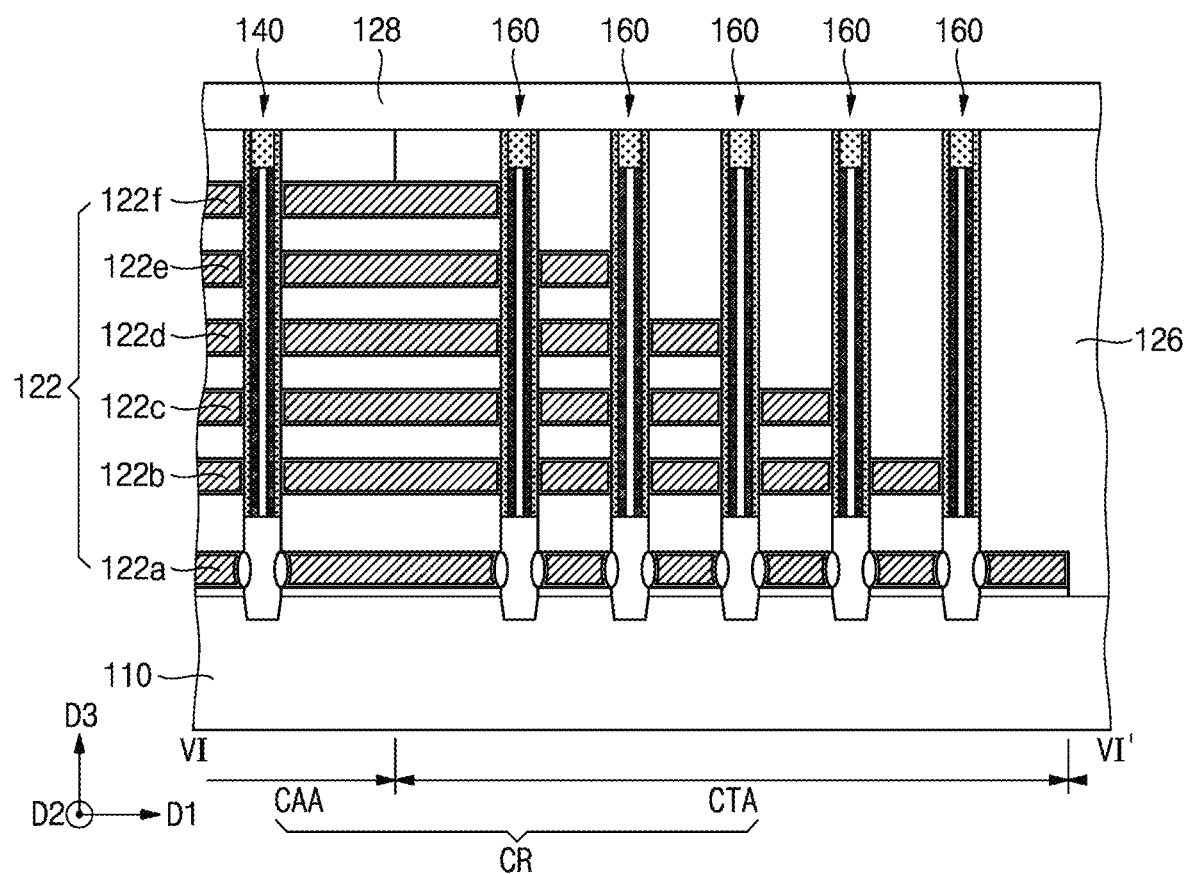

Referring to FIGS. 20A, 20B, and 20C, gate electrodes 122 (122a, 122b, 122c, 122d, 122e, and 122f) may be formed by patterning the gate conductive films 124. For example, the gate conductive films 124 formed inside the trench 127 may be removed by isotropic etching. The gate electrodes 122 adjacent to each other in a vertical direction are separated by the interlayer insulating layers 121, and may be thus electrically insulated from each other. Thus, a stack structure 120 in which the interlayer insulating layers 121 and the gate electrodes 122 are alternately stacked may be formed on the substrate 110 in the cell region CR. The gate electrodes 122 may extend from the cell array region CAA to the connection region CTA. The gate electrodes 122 may include gate pad parts GEP formed in a stepped shape in the connection region CTA.

A common source line 170, which includes a common source plug 171 and a common source spacer 172, may be formed on the common source region 111 by filling the trench 127. First, the common source spacer 172 may be formed by depositing an insulating film inside the trench 127 and performing anisotropic etching thereon. Next, the common source plug 171 may be formed by filling an inner space of the common source spacer 172 with a conductive material (e.g., tungsten) and performing an etch-back process or chemical mechanical polishing (CMP). The common source plug 171 may be electrically insulated from the gate electrodes 122 and may be in contact with the common source region 111 to be electrically connected to the common source region 111. The common source line 170 may extend along the trench 127 in the first direction D1. Next, an upper insulating layer 128 may be formed to cover top surfaces of the stack structure 120 and the mold insulation layer 126.

Referring to FIGS. 3, 4, and 6, the bit contact 137 and the bit line BL may be formed in the cell array region CAA of the cell block CB, and the gate contact 129 and the first metal line 183 may be formed in the connection region CTA. The peripheral contact 197 and the second metal line 185 may be formed in a peripheral device region.

The bit contact 137 may extend in the third direction D3 while passing through the upper insulating layer 128. The bit contact 137 may be formed to extend upward from the top of the first cell conductive pattern 136. The bottom of the bit contact 137 may be electrically connected to the first cell conductive pattern 136. The top of the bit contact 137 may be exposed at the upper insulating layer 128. The bit contact 137 may be formed by forming a contact hole passing through the upper insulating layer 128 and filling the contact hole with a conductive material. The bit line BL may be formed on the upper insulating layer 128 to cover the top of the bit contact 137. The bit line BL may extend in the second direction D2. The bit line BL may be electrically connected to the bit contact 137. The bit contact 137 may electrically connect the first cell channel structure 130 and the bit line BL to each other. The bit contact 137 and the bit line BL may not be formed in the cell array region CAA of the dummy block DB. The second cell channel structure 140, the first dummy channel structure 150, and the second dummy channel structure 160 may not be electrically connected to the bit line BL.

The gate contact 129 may extend in the third direction D3 while passing through either the upper insulating layer 128 or the upper insulating layer 128 and the mold insulating layer 126. The gate contact 129 may be formed by forming a contact hole passing through either the upper insulating layer 128 or the upper insulating layer 128 and the mold insulating layer 126 and filling the contact hole with a conductive material. The top of the gate contact 129 may be exposed at the upper insulating layer 128. The gate contact 129 may be electrically connected to the gate pad parts GEP of the gate electrodes 122 below the gate contact 129. The first metal line 183 may be formed on the upper insulating layer 128 to cover the top of the gate contact 129. The first metal line 183 may be electrically connected to the top of the gate contact 129. The first metal line 183 may be formed of metal (e.g., aluminum or copper). The gate contact 129 may electrically connect the gate electrodes 122 and the first metal line 183.

The peripheral contact 197 may extend in the third direction D3 while passing through the upper insulating layer 128, the mold insulating layer 126, and the peripheral protective layer 195. The peripheral contact 197 may be formed by forming a contact hole passing through the upper insulating layer 128, the mold insulating layer 126, and the peripheral protective layer 195 and filling the contact hole with a conductive material. The top of the peripheral contact 197 may be exposed at the upper insulating layer 128. The second metal line 185 may be formed to cover the top of the peripheral contact 197. The second metal line 185 may be electrically connected to the top of the peripheral contact 197. The peripheral contact 197 may electrically connect the peripheral circuit element 190 and the second metal line 185. The second metal line 185 may be electrically connected to the bit line BL or the first metal line 183.

Figure 17A:
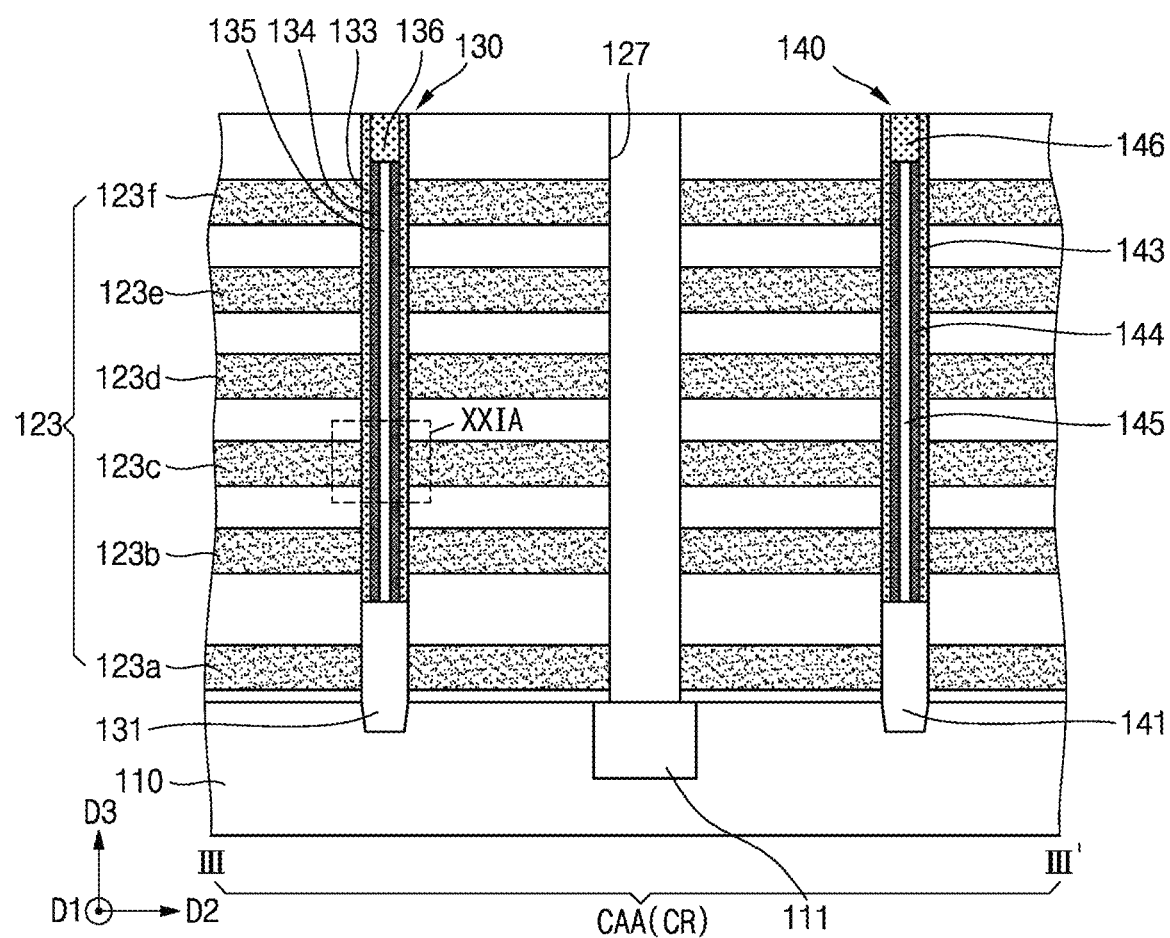
Figure 17B:
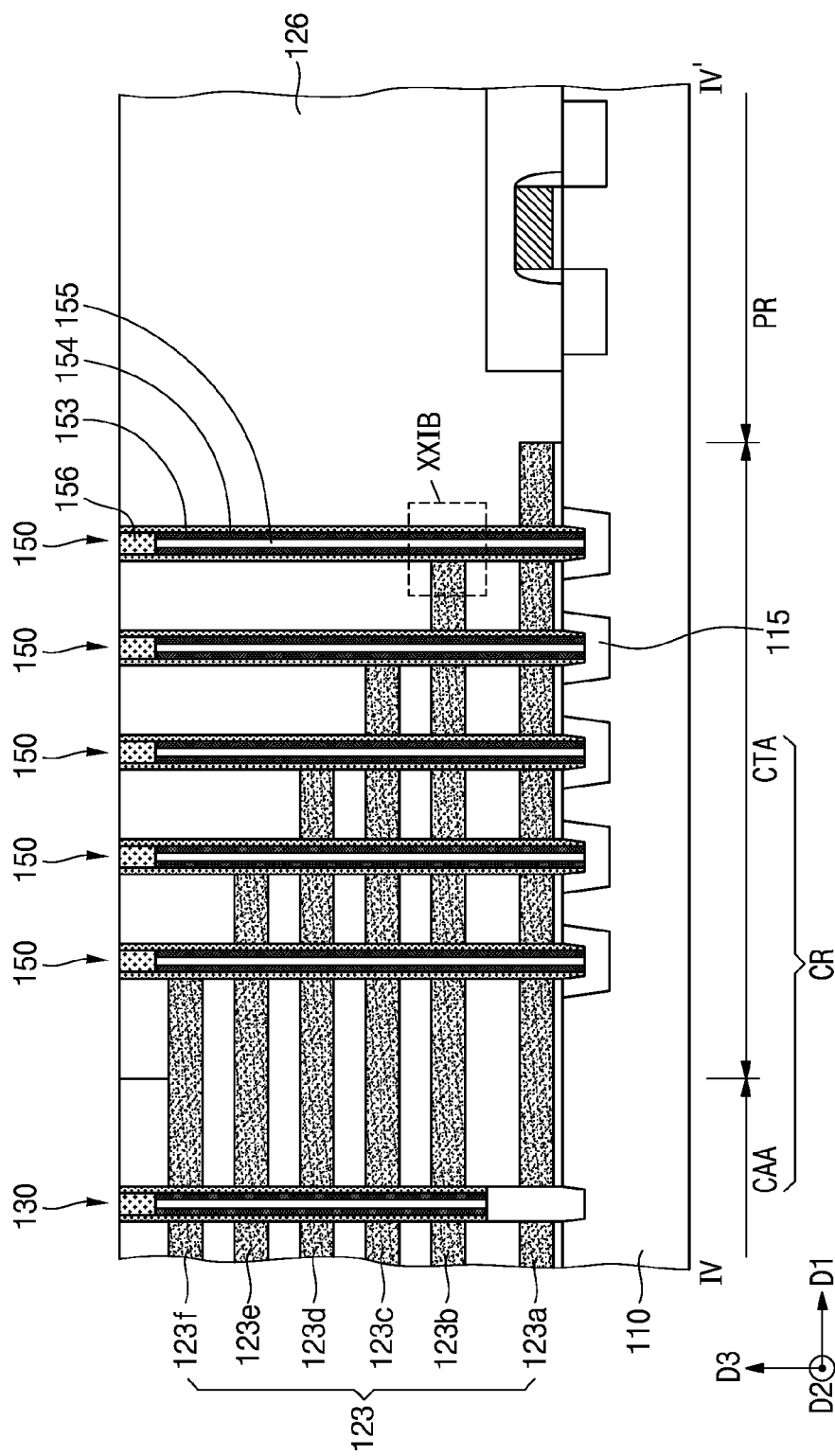
Figure 17C:
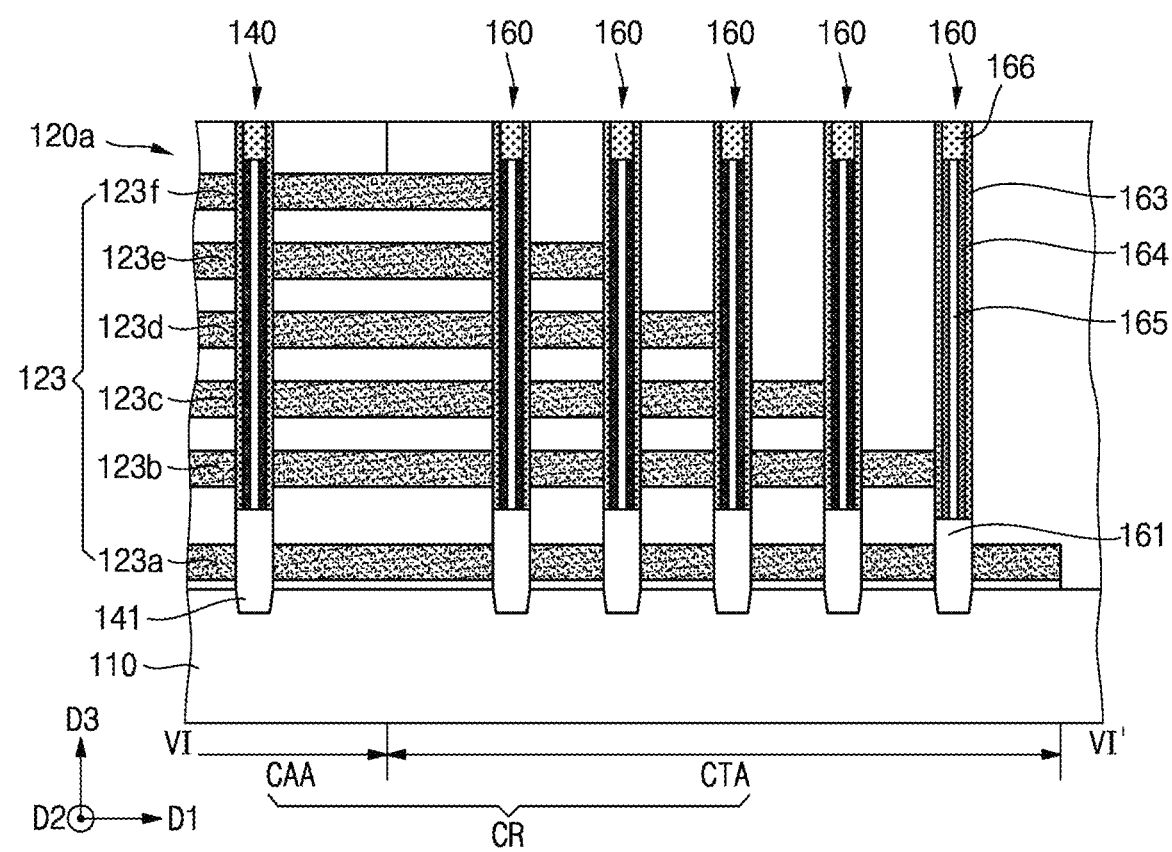
Figure 21A:
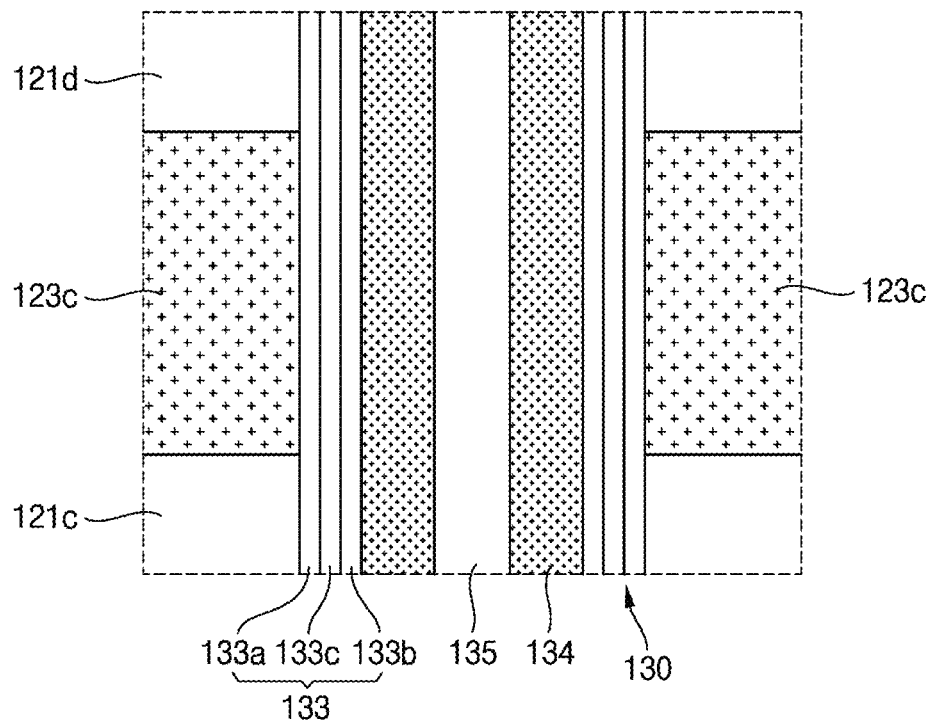
FIG. 21A is an enlarged view of a part XXIA of FIG. 17A.
Figure 21B:
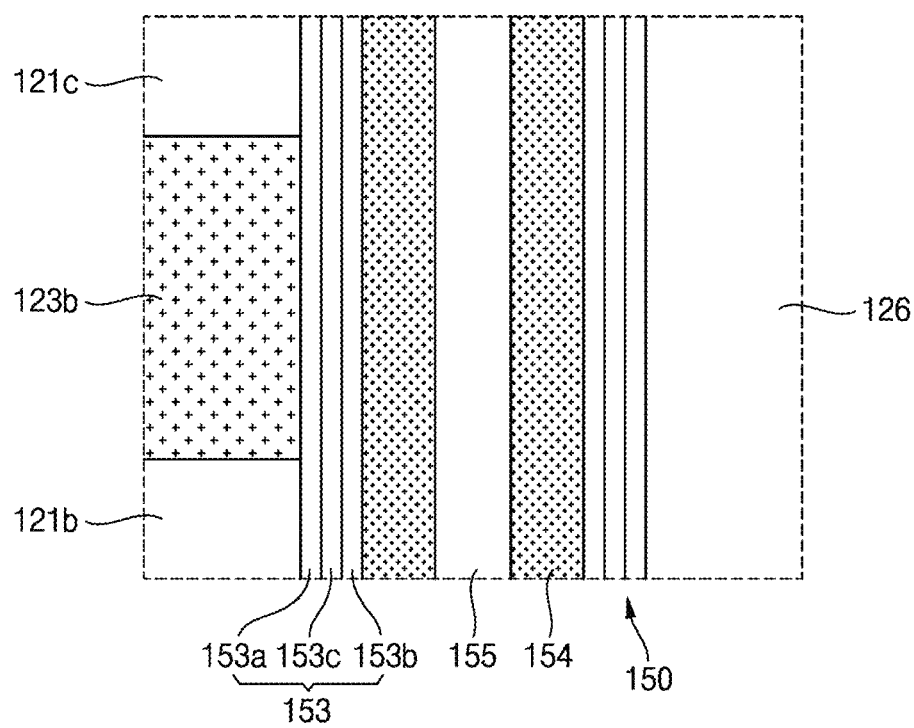
FIG. 21B is an enlarged view of a part XX1B of FIG. 17B.

FIG. 21A is an enlarged view of a part XXIA of FIG. 17A. FIG. 21B is an enlarged view of a part XX1B of FIG. 17B. FIGS. 21A and 21B are the same as the structures illustrated in FIGS. 7A and 7B except that the sacrificial layer 123c is in the place of the gate electrode 122c and the gate blocking insulation film 125 and the sacrificial layer 123b is in the place of the gate electrode 122b and the gate blocking insulation film 125.

A memory card including a semiconductor memory device according to an embodiment of inventive concepts will be described below.

Figure 22:
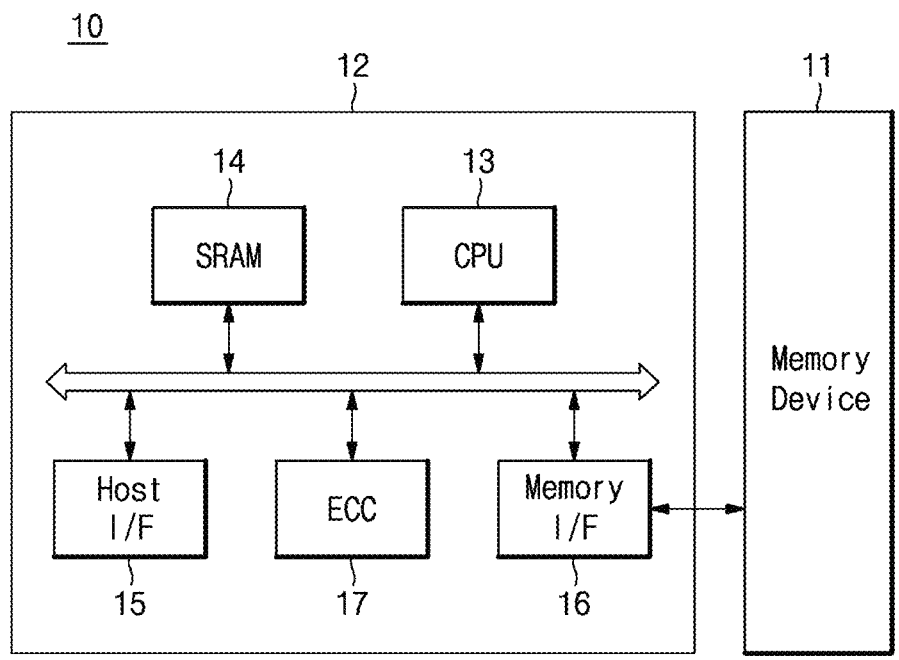
FIG. 22 is a block diagram of an example of a memory card including a semiconductor memory device according to an example embodiment of inventive concepts.

FIG. 22 is a block diagram of an example of a memory card including a semiconductor memory device according to an example embodiment of inventive concepts.

Referring to FIG. 22, a memory card 10 according to an example embodiment of inventive concepts may include a memory device 11 and a memory controller 12. The memory device 11 may include at least one among the memory semiconductor devices according to the above example embodiments. The memory device 11 may include at least one among a phase-change memory device, a magnetic memory device, a resistive memory device, a dynamic random access memory (DRAM) device, and a static random access memory (SRAM) device.

The memory controller 12 may control exchange of data between a host and the memory device 11. The memory controller 12 may include a central processing unit (CPU) 13, an SRAM 14, a host interface (I/F) 15, a memory I/F 16, and an error checking and correcting (ECC) block 17. The CPU 13 may control overall operations of the memory card 10. The SRAM 14 may be used as an operating memory of the CPU 13. The host I/F 15 may include a data exchange protocol between the memory card 10 and a host (not shown). The memory I/F 16 may connect the memory controller 12 and the memory device 11. The ECC block 17 may detect and correct an error in data read from the memory device 11. Although not shown, the memory card 10 may further include a read-only memory (ROM) device for storing code data for interfacing with the host. The memory card 10 may be used as a portable data storage card. The memory card 10 may be used as a solid-state disk (SDD) which may replace a hard disk of a computer system.

Next, an electronic system including a semiconductor memory device according to an example embodiment of inventive concepts will be described below.

Figure 23:
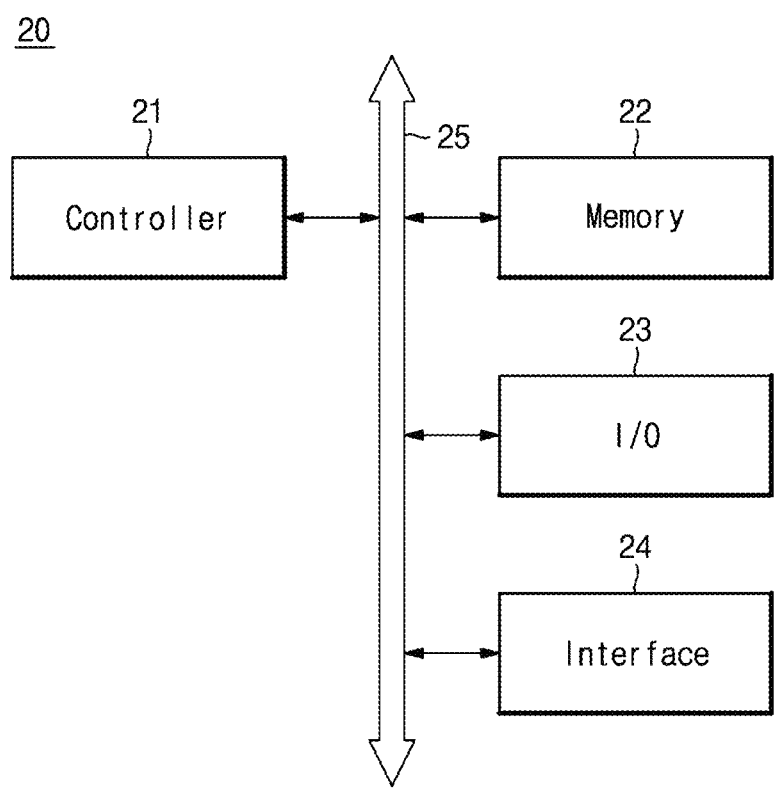
FIG. 23 is a block diagram of an example of an electronic system including a semiconductor memory device according to an example embodiment of inventive concepts.

FIG. 23 is a block diagram of an example of an electronic system including a semiconductor memory device according to an example embodiment of inventive concepts.

Referring to FIG. 23, an electronic system 20 may include a controller 21, a memory device 22, an input/output (I/O) device 23, an interface 24, and a bus 25. At least two elements among the controller 21, the memory device 22, the I/O device 23, and the interface 24 may be coupled to each other via the bus 25. The bus 25 is a path through which data is transmitted. The controller 21 may control performing of a data read operation and a data write operation with respect to the memory device 22. The controller 21 may include at least one among a microprocessor, a digital signal processor, a microcontroller, and logic devices for performing functions similar to those of the microprocessor, the digital signal processor, and the microcontroller. The memory device 22 may store data, a command, etc. The memory device 22 may include at least one among the semiconductor memory devices according to the above example embodiments. The memory device 22 may further include a phase-change memory device, a magnetic memory device, a resistive memory device, a DRAM device, and/or an SRAM device. The I/O device 23 may include a keypad, a keyboard, a display device, etc. The interface 24 may transmit data or receive data through a communication network. The interface 24 may be in a wired or wireless form. The interface 24 may include an antenna, a wired or wireless transceiver, etc. Although not shown, the electronic system 20 may be an operating memory device for improving an operation of the controller 21 and may further include at least one of a high-speed DRAM device and a high-speed SRAM device.

The electronic system 20 may be applicable to a personal digital assistant (PDA), a portable computer, a web tablet, a wireless phone, a mobile phone, a digital music player, a memory card, or all electronic products capable of transmitting and receiving information in a wireless environment.

According to some example embodiments of inventive concepts, whether a gate electrode is formed abnormally due to deformation thereof during a process can be determined by checking whether a second dummy channel structure is electrically in a contact with a substrate.

According to some example embodiments of inventive concepts, a relatively highly reliable semiconductor memory device can be achieved by securing uniformity of a stack structure of gate electrodes.

While some example embodiments of inventive concepts have been described with reference to the accompanying drawings, it will be understood by those of ordinary skill in the art that various changes in form and details may be made therein without departing from the spirit and scope of the inventive concepts as defined by the appended claims. The example embodiments described herein should be considered in descriptive sense only and not for purposes of limitation.

What is claimed is:

1. A method of manufacturing a semiconductor memory device comprising:
   providing a substrate including a cell block and a dummy block, the cell block and the dummy block each including a cell array region and a connection region;
   forming an isolation layer in the substrate in the connection region of the cell block;
   forming a stack mold structure in which a plurality of interlayer insulating layers and a plurality of sacrificial layers are alternately and repeatedly stacked, on the substrate;
   forming a mold insulating layer covering the stack mold structure;
   forming a first cell channel hole and a first dummy channel hole, the first cell channel hole vertically penetrating the stacked mold structure in the cell array region of the cell block, the first dummy channel hole vertically penetrating the stacked mold structure in the connection region of the cell block, the first cell channel hole exposing the substrate, the first dummy channel hole exposing the isolation layer;
   forming a second cell channel hole and a second dummy channel hole, the second cell channel hole vertically penetrating the stacked mold structure in the cell array region of the dummy block, the second dummy channel hole vertically penetrating the stacked mold structure in the connection region of the dummy block, the second dummy channel hole exposing the substrate;
   forming a first cell semiconductor pattern in the first cell channel hole, and a dummy semiconductor pattern in the second dummy channel hole;
   forming a first cell data storing pattern, a first cell channel pattern, and a first cell-embedded insulating pattern in the first cell channel hole;
   forming a second cell data storing pattern, a second cell channel pattern, and a second cell-embedded insulation pattern in the second cell channel hole;
   forming a first dummy data storing pattern, a first dummy channel pattern, and a first dummy-embedded insulating pattern in the first dummy channel hole; and forming a second dummy data storage pattern, a second dummy channel pattern, and a second dummy-embedded insulating pattern in the second dummy channel hole, wherein the first cell channel pattern is in contact with the first cell semiconductor pattern, and the first dummy channel pattern is in contact with the isolation layer.

2. The method of claim 1, wherein the second dummy channel pattern contacts the dummy semiconductor pattern.

3. The method of claim 1, wherein the forming the isolation layer further comprises forming the isolation layer in the substrate in the cell array region of the dummy block.

4. The method of claim 3, wherein the second cell channel hole exposes the isolation layer in the cell array region of the dummy block.

5. The method of claim 3, wherein the second cell channel pattern contacts the isolation layer in the cell array region of the dummy block.

6. The method of claim 1, further comprising:

forming a second cell semiconductor pattern in the second cell channel hole.

7. The method of claim 6, wherein the second cell channel pattern is in contact with the second cell semiconductor pattern.

8. The method of claim 1, wherein the forming the isolation layer comprises:

forming isolation grooves by etching the substrate; and filling the isolation grooves with an insulating material.

9. The method of claim 1, wherein the isolation layer has a higher concentration of impurities than the substrate.

10. The method of claim 1, further comprising:

forming a trench between the cell block and the dummy block by patterning the stacked mold structure.

11. The method of claim 10, further comprising:

forming a common source region in the substrate exposed by the trench.

* * * * *